(12) United States Patent
Konno et al.

(10) Patent No.: US 8,461,576 B2
(45) Date of Patent: Jun. 11, 2013

(54) ORGANIC LIGHT-EMITTING DIODE AND LIGHT SOURCE DEVICE INCLUDING SAME

(75) Inventors: Akitoyo Konno, Hitachi (JP); Shingo Ishihara, Mito (JP); Hiroshi Sasaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 322 days.

(21) Appl. No.: 12/962,925

(22) Filed: Dec. 8, 2010

(65) Prior Publication Data

US 2011/0147777 A1 Jun. 23, 2011

(30) Foreign Application Priority Data

Dec. 11, 2009 (JP) ................................ 2009-281104

(51) Int. Cl.
*H01L 51/52* (2006.01)
(52) U.S. Cl.
USPC ................... 257/40; 257/98; 257/E51.021
(58) Field of Classification Search
USPC .................... 257/E51.021, E33.064
See application file for complete search history.

(56) References Cited

U.S. PATENT DOCUMENTS

| 7,955,531 | B1* | 6/2011 | Khanarian ............ 264/1.7 |
| 8,022,619 | B2 | 9/2011 | Birnstock |
| 2004/0150329 | A1 | 8/2004 | Asai et al. |
| 2006/0043362 | A1 | 3/2006 | Ishikawa et al. |
| 2007/0029539 | A1 | 2/2007 | Yashima et al. |
| 2007/0176195 | A1* | 8/2007 | Kuiseko et al. .............. 257/98 |
| 2009/0079336 | A1 | 3/2009 | Yamada et al. |
| 2009/0267098 | A1* | 10/2009 | Choi ........................ 257/98 |
| 2010/0059778 | A1 | 3/2010 | Shimizu et al. |
| 2010/0213493 | A1* | 8/2010 | Hsu et al. .................. 257/98 |

FOREIGN PATENT DOCUMENTS

| JP | 2003-086353 | 3/2003 |
| JP | 2007-066883 | 3/2007 |
| JP | 2008-507809 | 3/2008 |

OTHER PUBLICATIONS

Extended European Search Report in EP 10194386.8, dated Apr. 6, 2011.
Office Action in JP 2009-281104, mailed Feb. 7, 2012 (3 pgs, in Japanese), [partial English language translation, 5 pgs.].

* cited by examiner

*Primary Examiner* — Stephen W Smoot
(74) *Attorney, Agent, or Firm* — Antonelli, Terry, Stout & Kraus, LLP.

(57) ABSTRACT

An organic light-emitting diode in accordance with the present invention includes: a reflective electrode; an organic layer formed on the reflective electrode; a transparent electrode formed on the organic layer; a transparent resin layer formed on the transparent electrode; and an encapsulation glass formed on the transparent resin layer. The organic layer includes a light-emitting point. Cone- or pyramid-shaped transparent resin structures are provided in the transparent resin layer in such a manner that each of the cone- or pyramid-shaped transparent resin structures splays from the transparent resin layer toward the encapsulation glass in a normal direction of the encapsulation glass. A refractive index of the transparent resin layer is 1.3 times or more to 1.6 times or less as high as that of the cone- or pyramid-shaped transparent resin structures.

20 Claims, 20 Drawing Sheets

$\theta_{pri}$ DEPENDENCE OF RELATIVE VALUE OF LIGHT EXTRACTION EFFICIENCY ($n_{LPL}$=1.6)

$\theta_{pri}$ DEPENDENCE OF RELATIVE VALUE OF LIGHT EXTRACTION EFFICIENCY ($n_{LPL}$=1.7)

T1-T1
CROSS-SECTIONAL VIEW

T2-T2
CROSS-SECTIONAL VIEW

T1-T1
CROSS-SECTIONAL VIEW

T2-T2
CROSS-SECTIONAL VIEW

ORGANIC LIGHT-EMITTING DIODE AND LIGHT SOURCE DEVICE INCLUDING SAME

CLAIM OF PRIORITY

The present application claims priority from Japanese patent application serial no. 2009-281104 filed on Dec. 11, 2009, the content of which is hereby incorporated by reference into this application.

BACKGROUND OF THE INVENTION

1. Field of the Invention

The present invention relates to organic light-emitting diodes and light source devices including the organic light-emitting diodes.

2. Description of Related Art

JP-A 2003-86353 discloses a conventional art. The purpose of the conventional art is to provide a transparent substrate which can improve light extraction efficiency of organic electroluminescence (EL) elements at a low cost, and by using this, to provide organic EL elements with higher light extraction efficiency. The conventional art relates to an organic EL element in which: light-condensing structures (microlenses, microprisms, etc.) are disposed between a transparent substrate and a transparent electrode; and a light-condensing layer flattened with transparent resin having a higher refractive index than that of the light-condensing structures is provided.

The conventional art also discloses a method for manufacturing transparent substrates for organic EL, comprising the steps of: applying a transparent resin on a transparent substrate for organic EL; pressing the transparent resin against a member having a surface shape of a casting mold for the light-condensing structures and hardening it to form the light-condensing structures; further applying another transparent resin with a higher refractive index than that of the transparent resin on the substrate; and pressing the another transparent resin against a member with a flat surface and hardening it to flatten it.

In the conventional art, unfortunately, since reflection occurs on the interface between a transparent resin layer and an encapsulation glass in an organic light-emitting diode, there is a problem that is difficult to significantly improve light extraction efficiency.

SUMMARY OF THE INVENTION

In view of the foregoing, it is an objective of the present invention to provide an organic light-emitting diode with improved light extraction efficiency and a light source device including the organic light-emitting diode.

(I) According to one aspect of the present invention, there is provided an organic light-emitting diode having: a reflective electrode; an organic layer formed on the reflective electrode; a transparent electrode formed on the organic layer; a transparent resin layer formed on the transparent electrode; and an encapsulation glass formed on the transparent resin layer. Herein, the organic layer includes a light-emitting point. Cone- or pyramid-shaped transparent resin structures are provided in the transparent resin layer in such a manner that each of the cone- or pyramid-shaped transparent resin structures splays from the transparent resin layer toward the encapsulation glass in a normal direction of the encapsulation glass. A refractive index of the transparent resin layer is 1.3 times or more to 1.6 times or less as high as that of the cone- or pyramid-shaped transparent resin structures.

(II) According to another aspect of the present invention, there is provided a light source device including the above-described organic light-emitting diode.

In the above aspects (I) and (II) of the invention, the following modifications and changes can be made.

(i) The refractive index of the transparent resin layer is not less than 2.15 and not more than 2.25; and an apex angle (unit: degree) of a cross section including a normal line of the encapsulation glass of each of the cone- or pyramid-shaped transparent resin structures is "2(44.3x−18±5)". Here, in the present invention, "x" represents a ratio between the refractive index of the transparent resin layer and the refractive index of the cone- or pyramid-shaped transparent resin structures.

(ii) The refractive index of the transparent resin layer is not less than 2.05 and not more than 2.15; and an apex angle (unit: degree) of a cross section including a normal line of the encapsulation glass of each of the cone- or pyramid-shaped transparent resin structures is "2(44.3x−17.8±5)".

(iii) The refractive index of the transparent resin layer is not less than 1.95 and not more than 2.05; and an apex angle (unit: degree) of a cross section including a normal line of the encapsulation glass of each of the cone- or pyramid-shaped transparent resin structures is "2(39.5x−10.3±5)".

(iv) The refractive index of the transparent resin layer is not less than 1.85 and not more than 1.95; and an apex angle (unit: degree) of a cross section including a normal line of the encapsulation glass of each of the cone- or pyramid-shaped transparent resin structures is "2(37.5x−5.7±5)".

(v) The refractive index of the transparent resin layer is not less than 1.75 and not more than 1.85; and an apex angle (unit: degree) of a cross section including a normal line of the encapsulation glass of each of the cone- or pyramid-shaped transparent resin structures is "2(45.1x−12±5)".

(vi) The refractive index of the transparent resin layer is not less than 1.65 and not more than 1.75; and an apex angle (unit: degree) of a cross section including a normal line of the encapsulation glass of each of the cone- or pyramid-shaped transparent resin structures is "2(48.9x−13.5±5)".

(vii) The refractive index of the transparent resin layer is not less than 1.55 and not more than 1.65; and an apex angle (unit: degree) of a cross section including a normal line of the encapsulation glass of each of the cone- or pyramid-shaped transparent resin structures is "2(58x−20.7±5)".

(viii) The light-emitting point emits light at an emission peak wavelength of $\lambda$ (unit: nm); and the following relationship is satisfied: "$(2m-155/180)\lambda/4/n/(\cos 30°) \leq ad \leq (2m-155/180)\lambda/4/n/(\cos 46°)$". Here, in the present invention, "ad" represents a height from an interface between the reflective electrode and the organic layer to the light-emitting point ("d" (unit: nm) represents a thickness of the organic layer, and "a" represents a value more than 0 but less than 1 ($0<a<1$)); "n" represents a refractive index of the organic layer; and "m" represents an integer equal to 1 or greater.

(ix) The light-emitting point emits light at an emission peak wavelength of $\lambda$ (unit: nm); and the following relationship is satisfied: "$(2m-155/180)\lambda/4/n/(\cos 30°) \leq ad \leq (2m-155/180)\lambda/4/n/(\cos 43°)$".

(x) The light-emitting point emits light at an emission peak wavelength of $\lambda$ (unit: nm); and the following relationship is satisfied: "$(2m-155/180)\lambda/4/n/(\cos 30°) \leq ad \leq (2m-155/180)\lambda/4/n/(\cos 45°)$".

(xi) The light-emitting point emits light at an emission peak wavelength of $\lambda$ (unit: nm); and the following relationship is satisfied: "$(2m-155/180)\lambda/4/n/(\cos 28°) \leq ad \leq (2m-155/180)\lambda/4/n/(\cos 43°)$".

(xii) the light-emitting point emits light at an emission peak wavelength of λ (unit: nm); and the following relationship is satisfied: "$(2m-155/180)\lambda/4/n/(\cos 28°) \leq ad \leq (2m-155/180)\lambda/4/n/(\cos 44°)$".

(xiii) The light-emitting point emits light at an emission peak wavelength of λ (unit: nm); and the following relationship is satisfied: "$(2m-155/180)\lambda/4/n/(\cos 26°) \leq ad \leq (2m-155/180)\lambda/4/n/(\cos 44°)$".

(xiv) the light-emitting point emits light at an emission peak wavelength of λ (unit: nm); and the following relationship is satisfied: "$(2m-155/180)\lambda/4/n/(\cos 24°) \leq ad \leq (2m-155/180)\lambda/4/n/(\cos 43°)$".

(xv) The cone- or pyramid-shaped transparent resin structures are pyramid-shaped.

(xvi) The cone- or pyramid-shaped transparent resin structures are cone-shaped.

(xvii) The cone- or pyramid-shaped transparent resin structures are six-sided pyramid-shaped.

(xviii) Bases of the cone- or pyramid-shaped structures are closely packed on an interface between the encapsulation glass and the transparent resin layer.

(III) According to still another aspect of the present invention, there is provided an organic light-emitting diode having: a reflective electrode; an organic layer formed on the reflective electrode; a transparent electrode formed on the organic layer; a transparent resin layer formed on the transparent electrode; and an encapsulation glass formed on the transparent resin layer. Herein, the organic layer includes a light-emitting point. Cone- or pyramid-shaped transparent resin structures are provided in the transparent resin layer in such a manner that each of the cone- or pyramid-shaped transparent resin structures splays from the transparent resin layer toward the encapsulation glass in a normal direction of the encapsulation glass. A refractive index of the transparent resin layer is not less than 1.7, and is 1.1 times or more as high as that of the cone- or pyramid-shaped transparent resin structures.

Advantages of the Invention

According to the present invention, it is possible to provide an organic light-emitting diode with improved light extraction efficiency and a light source device including the same. Problems, configurations, and advantages other than those described above will be specifically set forth in the following description of embodiments.

DETAILED DESCRIPTION OF THE PREFERRED EMBODIMENTS

Figure 27:
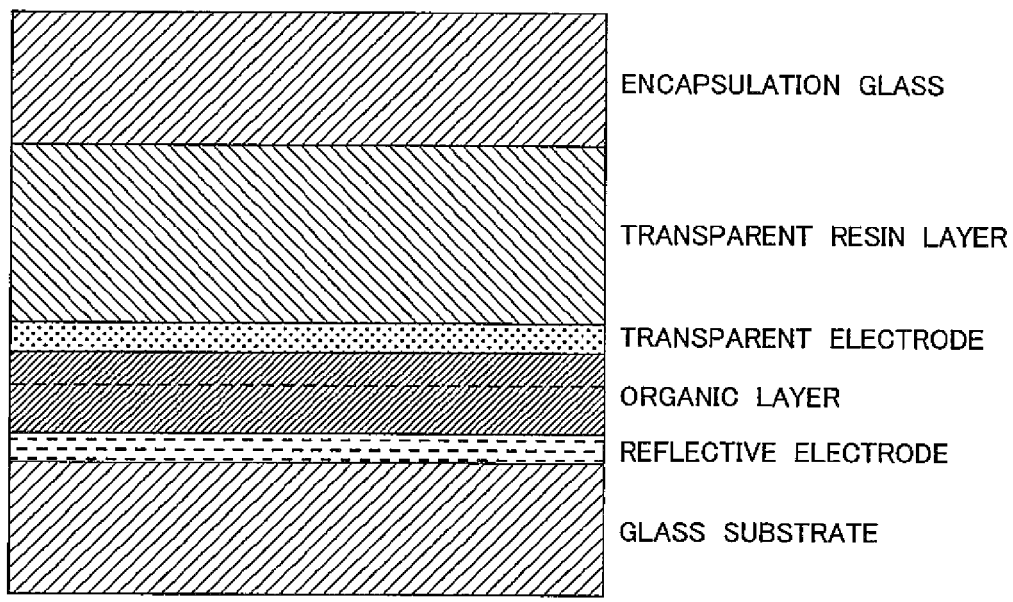
FIG. 27 is a schematic diagram showing a cross-sectional view of a basic configuration of an organic light-emitting diode.

First, problems in improving light extraction efficiency of an organic light-emitting diode will be described here. FIG. 27 is a schematic diagram showing a cross-sectional view of a basic configuration of an organic light-emitting diode. As shown in FIG. 27, a layer of organic molecules is formed on a reflective electrode formed on a glass substrate; a transparent electrode, such as ITO (tin-doped indium oxide) and IZO (zinc-doped indium oxide), is formed on the organic layer; a transparent resin layer is disposed on the transparent electrode; and an encapsulation glass is disposed on the transparent resin layer.

Aluminum is generally used for the reflective electrode. For example, when the reflective electrode is used as a cathode, a layer called an electron transport layer is formed on the reflective electrode, and a layer called a hole transport layer is formed on the transparent electrode. A layer called a light-emitting layer is formed between the electron transport layer and the hole transport layer. The electrons and holes recombine within the region approximately 10 nm off either from the interface between the light-emitting layer and the electron transport layer or from the interface between the light-emitting layer and the hole transport layer, and the organic layer emits light. On which side of the light-emitting layer the light emission mainly occurs, on the hole transport layer side or on the electron transport layer side, can be arbitrarily designed since it depends on the mobility and other properties of the materials used. In the present specification, the interface where the light emission mainly occurs is called a "light-emitting point."

Possible materials for the transparent resin layer, which joins the transparent electrode and the encapsulation glass, include adherent transparent resins, such as PET (polyethylene terephthalate), silicone resins, acrylic resins, polyimide resins, and epoxy resins. Also, refractive indexes can be controlled by dispersing fine particles with a high refractive index, such as fine particles of titanium oxide, in these base materials. The refractive index of the organic layer is usually about 1.8, that of the transparent electrode is about 2, that of the base material for the transparent resin layer is about 1.4 to 1.6, and that of the encapsulation glass is about 1.51.

The light emitted from the light-emitting point passes through the transparent electrode, the transparent resin layer, and the encapsulation glass, before being emitted outwardly. Unfortunately, however, the amount of light extracted outwardly can be very small due to reflection on the interface between the transparent electrode and the transparent resin layer, on the interface between the transparent resin layer and the encapsulation glass, and on the interface between the encapsulation glass and the atmosphere.

In order to reduce the reflectivity on the interface between the transparent electrode and the transparent resin layer, it is desirable that the refractive index of the transparent resin layer be high. However, a higher refractive index of the transparent resin layer inevitably means a higher reflectivity on the interface between the transparent resin layer and the encapsulation glass.

Figure 28:
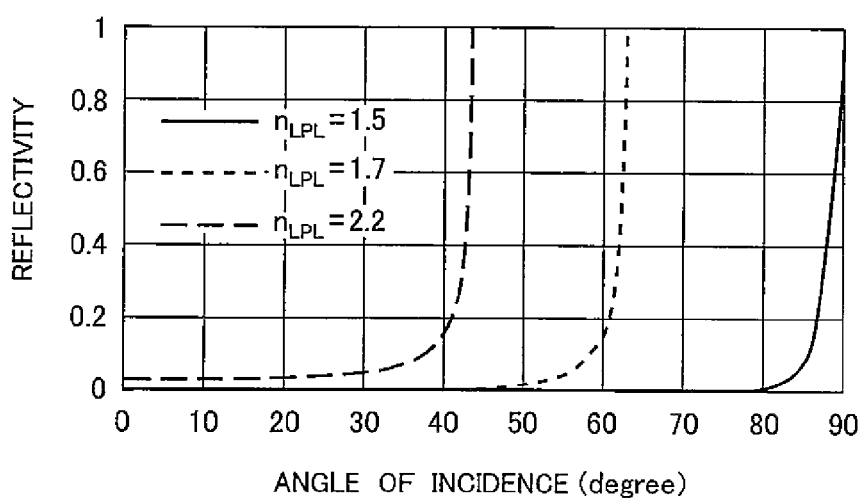
FIG. 28 is a graph showing a relationship between incidence angle of light and interface reflectivity between an encapsulation glass and a transparent resin layer.

FIG. 28 is a graph showing a relationship between incidence angle of light and interface reflectivity between an encapsulation glass and a transparent resin layer. The light is incident from the transparent resin layer side on the encapsulation glass, assuming that the refractive index of the encapsulation glass is 1.51, and the refractive index of the transparent resin layer $n_{LPL}$ is 1.5, 1.7, and 2.2. As shown in FIG. 28, it is observed that the critical angle (the angle of incidence at which the reflectivity is 1) becomes smaller as the refractive index of the transparent resin layer increases. The light incident at any angle above the critical angle is totally reflected and cannot go to the side of the encapsulation glass.

Conventionally, microprisms and other structures with a lower refractive index than that of the transparent resin layer have been disposed in the transparent resin layer to control the light distribution in the transparent resin layer and thus to improve light extraction efficiency. In the conventional art, however, the refractive index of the transparent resin, and the refractive index and the angle of inclination of microprisms are not defined, not only failing to define the configuration to achieve the highest efficiency, but also resulting in configurations with low efficiency.

The present invention has been made in view of the above mentioned problems and aims to provide a technology for obtaining high light extraction efficiency in an organic light-emitting diode in which: a reflective electrode, an organic layer including a light-emitting layer, a transparent electrode, a transparent resin layer, and an encapsulation glass are laminated in this order; and cone- or pyramid-shaped transparent resin structures with a lower refractivity index than that of the transparent resin layer are provided in the transparent resin layer, each of the cone- or pyramid-shaped transparent resin structures splaying toward the encapsulation glass.

The present invention will be described in further detail hereinafter by demonstrating specific embodiments. Since the following embodiments are to show specific examples of the present invention, the present invention is not to be considered limited to these embodiments, and various alterations and modifications can be made by those skilled in the art within the scope of the technical idea as disclosed in the present specification. In addition, like parts having like functions are designated by like reference numerals without repeating the description thereof.

First Embodiment of the Invention

Figure 1:
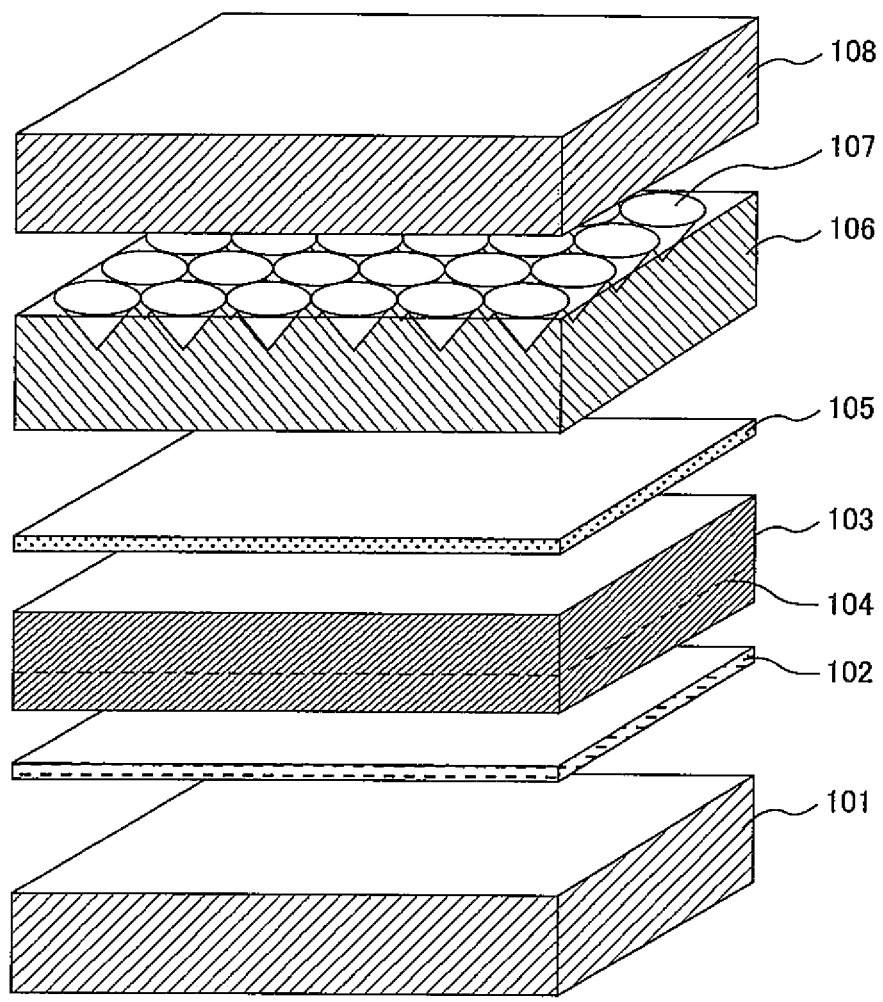
FIG. 1 is a schematic diagram showing an exploded perspective view of an organic light-emitting diode in accordance with a first embodiment of the present invention.
Figure 2:
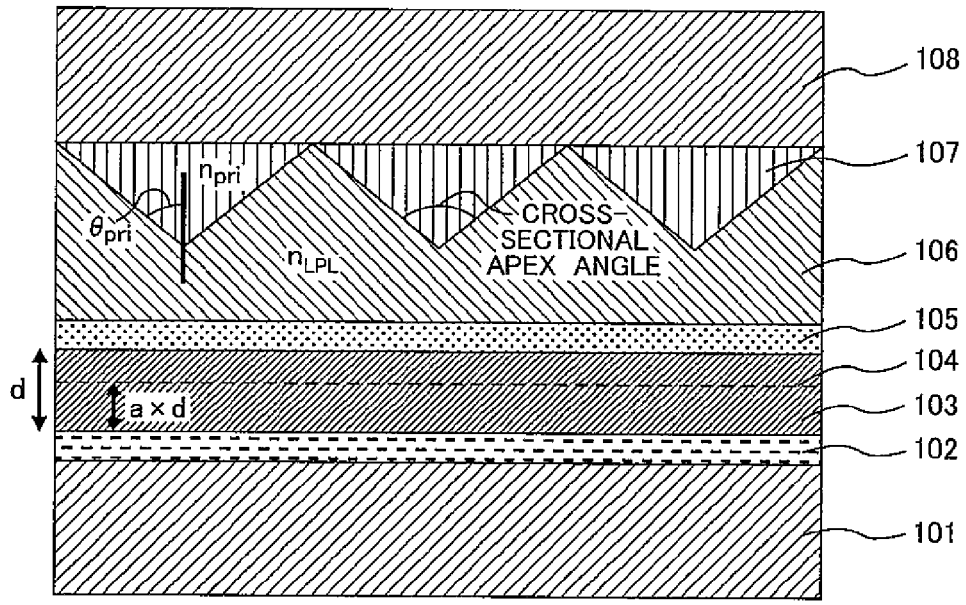
FIG. 2 is a schematic diagram showing a cross-sectional view of an organic light-emitting diode in accordance with the first embodiment of the present invention.

FIG. 1 is a schematic diagram showing an exploded perspective view of an organic light-emitting diode in accordance with a first embodiment of the present invention, and FIG. 2 is a schematic diagram showing a cross-sectional view of an organic light-emitting diode in accordance with the first embodiment of the invention. As shown in FIGS. 1 and 2, the organic light-emitting diode of the present embodiment includes: a glass substrate 101; an aluminum reflective electrode 102; an organic layer 103; an IZO transparent electrode 105; a transparent resin layer 106; and an encapsulation glass 108. The organic layer 103 composed of organic molecules is formed on the aluminum reflective electrode 102 formed on the glass substrate 101. The organic layer 103 includes a light-emitting point 104. The IZO transparent electrode 105 is formed on the organic layer 103. Also, the transparent resin layer 106 is disposed on the transparent electrode 105. The transparent resin layer 106 includes acrylic resin and fine particles of titanium oxide. The refractive index of the transparent resin layer 106 can be controlled by dispersing the fine particles of titanium oxide in the acrylic resin. The encapsulation glass 108 is disposed on the transparent resin layer 106.

In addition, cone-shaped transparent resin structures 107 are embedded in the transparent resin layer 106, with the circular bases bonded to the surface of the encapsulation glass 108. Each of the cone-shaped transparent resin structures 107 splays toward the encapsulation glass 108 in the normal direction of the encapsulation glass 108. It is desirable that the refractive index of the transparent resin layer 106 be 1.3 times or more to 1.6 times or less as high as that of the cone-shaped transparent resin structures 107. Here, the refractive index of each layer can be measured at room temperature by FilmTek 3000 (purchased from YA-MAN, Ltd.), an optical thin film measuring system, for example. The organic light-emitting diode in FIG. 1 becomes a light source device when equipped with a drive unit and others.

PET (polyethylene terephthalate), silicone resins, acrylic resins, polyimide resins, and epoxy resins may be used for the cone-shaped transparent resin structures 107. Furthermore, by mixing transparent fine particles into a base material such as these resins, the refractive index thereof can be reduced. This is because microgaps occur between the base material resin and the fine particles. Materials with small absorption in the visible region and a refractive index of about 1.5 or less, such as silicon oxide and magnesium fluoride, are suitable for the transparent fine particles.

It is desirable that the fine particles be 80 nm or smaller in size so that the decrease in transmittance due to Rayleigh scattering can be minimized. For example, when silicon oxide with a refractive index of 1.5 is used in a resin-to-particle mixing volume ratio of about 1:9, the refractive index can be reduced to about 1.2. When magnesium fluoride with a refractive index of 1.38 is used in a resin-to-particle mixing volume ratio of about 2:8, the refractive index can be reduced to about 1.2.

As shown in FIG. 2, the distance from the interface between the reflective electrode 102 and the organic layer 103 to the center of the light-emitting point 104 is expressed by "a×d" with "a" representing a value more than 0 but less than 1 (0<a<1) and "d" representing the thickness (unit: nm) of the organic layer 103. Incidentally, "a=0" leads to a position on the interface between the reflective electrode 102 and the organic layer 103, and "a=1" leads to a position on the interface between the organic layer 103 and the transparent electrode 105. The half angle of the cross-sectional apex angle of the cone-shaped transparent resin structures 107, the refractive index of the cone-shaped transparent resin structures 107, and the refractive index of the transparent resin layer 106 are expressed by $\theta_{pri}$, $n_{pri}$, and $n_{LPL}$, respectively. The apex angle of the cone-shaped transparent resin structures 107 in the cross section perpendicular to the encapsulation glass 108 is equivalent to two times $\theta_{pri}$. Besides, the above-mentioned cross section of each of the cone-shaped transparent resin structures 107 passes through the center of the circular base of each of the cone-shaped transparent resin structures 107.

Figure 3:
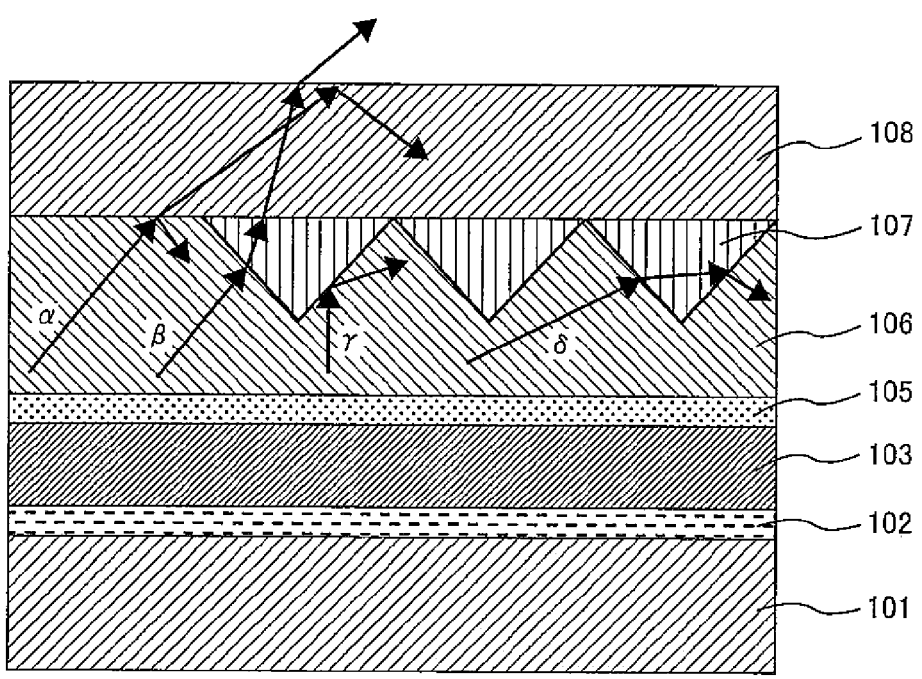
FIG. 3 is a schematic diagram showing a cross-sectional view of an organic light-emitting diode for explaining a principle of light extraction efficiency improvement in accordance with the first embodiment of the present invention.

FIG. 3 is a schematic diagram showing a cross-sectional view of an organic light-emitting diode for explaining a principle of light extraction efficiency improvement in accordance with the first embodiment of the present invention. High directivity of the light distribution in the transparent resin layer 106 can be obtained by disposing the cone-shaped transparent resin structures 107 with a lower refractive index than that of the transparent resin layer 106 in the transparent resin layer 106. Herein, highly directive light distribution means a relatively small angle of incidence on the interface between the transparent resin layer 106 and the encapsulation glass 108, namely, an increased light intensity of a component in the normal direction on the interface.

As shown by the ray path represented by "α" in FIG. 3, when the cone-shaped transparent resin structures 107 are not present, total internal reflection occurs on the interface between the transparent resin layer 106 and the encapsulation glass 108 or on the interface between the encapsulation glass 108 and the atmosphere. By inserting the cone-shaped transparent resin structures 107, as shown by the ray path represented by "β" in FIG. 3, the angle of incidence on the interface between the transparent resin layer 106 and the encapsulation glass 108, and the angle of incidence on the interface between the encapsulation glass 108 and the atmosphere can be reduced. As a result, transmittance on each interface can be substantially improved.

However, as shown by the ray path represented by "γ" in FIG. 3, light travelling in the front direction can totally reflect off the interface between the cone-shaped resin structures 107 and the transparent resin layer 106, increasing the angle of incidence on the interface between the transparent resin layer 106 and the encapsulation glass 108. Also, as shown by the ray path represented by "δ" in FIG. 3, with respect to a light with an originally high angle of incidence on the interface between the transparent resin layer 106 and the encapsulation glass 108, the angle of light distribution can be even larger.

Therefore, in order to maximize light extraction efficiency, the following parameters need to be optimized:

1) $n_{LPL}$ (refractive index of transparent resin layer 106);
2) $n_{pri}$ (refractive index of cone-shaped transparent resin structures 107);
3) Light distribution in transparent resin layer 106 before light enters into cone-shaped transparent resin structures 107; and
4) Apex angle of cone-shaped transparent resin structures 107 ($2\theta_{pri}$).

In the present embodiment, increasing the proportion of light represented by "β" leads to the maximization of light extraction efficiency. Therefore, what is important is light distribution in the transparent resin layer 106 before light enters into the cone-shaped transparent resin structures 107. This light distribution can be controlled by $n_{LPL}$ and interference conditions hereinafter described. Furthermore, the light distribution angle due to refraction in the cone-shaped transparent resin structures 107 can be controlled by the ratio of $n_{LPL}$ and $n_{pri}$, and by the apex angle of the cone-shaped transparent resin structures 107.

Figure 4:
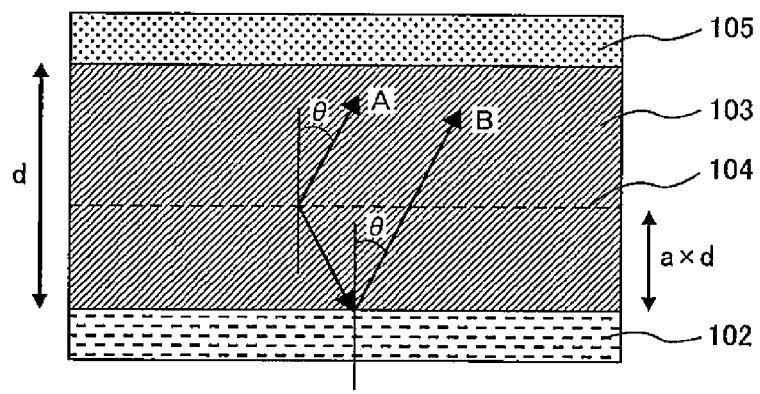
FIG. 4 is a schematic diagram showing a cross-sectional view of an organic light-emitting diode for explaining conditions of interference effects.

Next, interference conditions will be described. FIG. 4 is a schematic diagram showing a cross-sectional view of an organic light-emitting diode for explaining conditions of interference effects. As mentioned before, when "a" is any number more than 0 but less than 1 (0<a<1), the light-emitting point 104 occurs at a height of "a×d" above the interface between the reflective electrode 102 and the organic layer 103, and the point where this light-emitting point 104 is located is assumed to be a point light source. The arrows in the view show directions of light propagation.

Light emitted from a light source partly travels directly to the transparent electrode 105, as shown by the ray path represented by "A" in FIG. 4, and partly reflects off the reflective electrode 102 before traveling to the transparent electrode 105, as shown by the ray path represented by "B". The light intensity becomes highest due to interference effects when the light distribution angle is θ (unit: degree) at which the phase difference between the light "A" and the light "B" is an integral multiple of 2π. Herein, the light distribution angle is the angle of the light direction when the normal direction of the interface of each layer is the reference angle (0°).

The angle $\theta_{cof}$ (unit: degree) at which the light intensity becomes highest can be expressed by the following equation:

$$\theta_{cof} = \cos^{-1}((2 \times b - \phi_m/180) \times \lambda/(4\pi \times n \times a \times d)) \times 180/\pi \quad \text{Eq. 1}$$

where "b" is an integer equal to or greater than 1; "λ" represents a wavelength (unit: nm); "n" represents the refractive index of the organic layer 103; "d" represents the thickness of the organic layer 103 (unit: nm); "a" represents a value more than 0 but less than 1 (0<a<1); and "$\phi_m$" is the phase difference due to reflection off the reflective electrode 102.

Although the value of $\theta_{cof}$ varies from about 140° to 160° depending on the wavelength and the angle of incidence, it is typically 155°. As shown by Eq. 1, $\theta_{cof}$ varies depending on "a". In other words, $\theta_{cof}$ can be controlled by the distance from the interface between the reflective electrode 102 and the organic layer 103 to the light-emitting point 104. The amount of light to be extracted to the transparent resin layer 106 and the light distribution in the transparent resin layer 106 can be controlled by the direction of the light distribution angle at which $\theta_{cof}$ is set. The setting of $\theta_{cof}$ in a manner such as this is called the setting of an interference condition.

In addition, interference conditions can be set in a relatively highly flexible manner by controlling the thickness of the hole transport layer and other organic materials with a high mobility. Possible materials for the hole transport layer includes N,N'-bis(3-methylphenyl)-N,N'-diphenyl-[1,1'-biphenyl]-4,4'-diamine (TPD), and 4,4'-bis[N-(1-naphtyl)-N-phenyl-amino]biphenyl (α-NPD).

Figure 5:
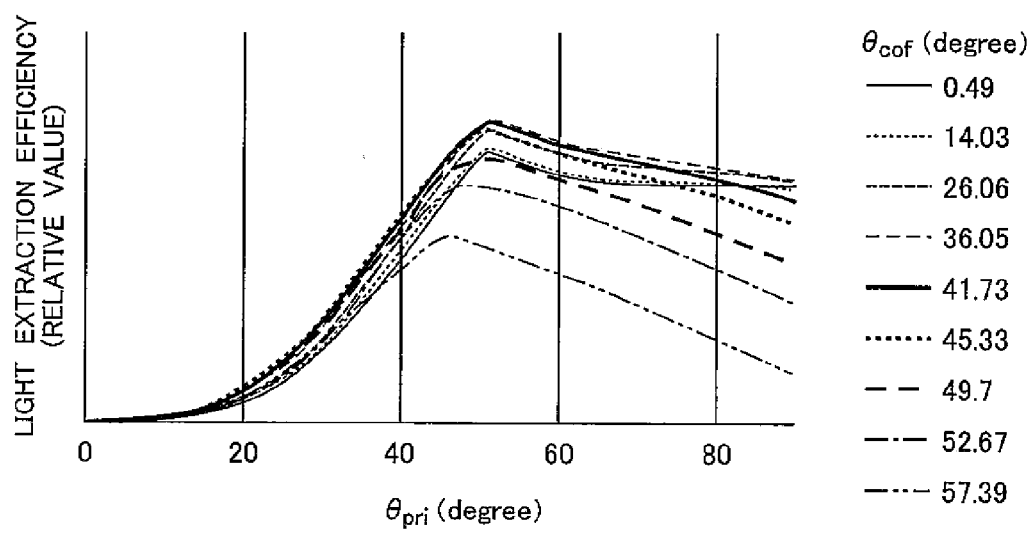
FIG. 5 is a graph showing simulation results of a relationship between half angle of apex angle of cone-shaped transparent resin structures $\theta_{pri}$ (unit: degree) and light extraction efficiency (relative value) in accordance with the first embodiment of the present invention.

FIG. 5 is a graph showing simulation results of a relationship between $\theta_{pri}$ (unit: degree) and light extraction efficiency (relative value) in accordance with the first embodiment of the present invention. The simulation was performed under various interference conditions where: the wavelength of light λ is 460 nm; the thickness of the organic layer 103 d is 150 nm; the refractive index of the transparent resin layer 106 $n_{LPL}$ is 2.2; and the refractive index of the cone-shaped transparent resin structures 107 $n_{pri}$ is 1.4.

As shown in FIG. 5, the relative value of light extraction efficiency shows a strong dependence on $\theta_{cof}$ and $\theta_{pri}$, monotonically increasing with $\theta_{pri}$ in the range from 0° to about 50° and reaching its peak value with $\theta_{pri}$ being about 50°. With $\theta_{pri}$ larger than about 50°, the light extraction efficiency monotonically decreases. The inventors believe this is because when $\theta_{pri}$ is small, a significant amount of light totally reflects off the interface between the cone-shaped transparent resin structures 107 and the transparent resin layer 106 (as shown by the ray path represented by "γ" in FIG. 3), and when $\theta_{pri}$ is about 50°, high directivity can be obtained effectively by the presence of the cone-shaped transparent resin structures 107 (as shown by the ray path represented by "β" in FIG. 3). Also, as $\theta_{pri}$ becomes larger, the amount of light with a larger distribution angle increases (as shown by the ray path represented by "δ" in FIG. 3).

Meanwhile, the relative value of light extraction efficiency with $\theta_{pri}$ being 90° corresponds to that when the cone-shaped transparent resin structures 107 are not disposed in the transparent resin layer 106. In other words, by setting conditions such that any relative value of light extraction efficiency above that when $\delta_{pri}$ is 90° can be obtained, light extraction efficiency can be improved compared to when the cone-shaped transparent resin structures 107 are not present.

As shown in FIG. 5, when $n_{LPL}$ is 2.2 and $n_{pri}$ is 1.4, light extraction efficiency is relatively high with $\theta_{cof}$ being 50° or smaller, and light extraction efficiency can be improved by setting $\theta_{pri}$ at from about 45° to 80° compared to when the cone-shaped transparent resin structures 107 are not present. More preferably, by setting $\theta_{cof}$ at from about 30° to 46° and $\theta_{pri}$ at from about 45° to 55°, light extraction efficiency can be further improved. In particular, light extraction efficiency can be maximized by setting interference conditions such that $\theta_{cof}$ is 36.05° and $\theta_{pri}$ is 51°.

In addition, when solved for "a", Eq. 1 indicates that the range of "a" which corresponds to $\theta_{cof}$ in the range from about 30° to 46° is from 0.56 to 0.70. Therefore, when the thickness of the organic layer 103 "d" is 150 nm, the distance from the interface between the reflective electrode 102 and the organic layer 103 to the center of the light-emitting point 104 is in the range from 84 to 105 nm.

As described above, light extraction efficiency can be improved by inserting the cone-shaped transparent resin structures 107 and by appropriately controlling: the relationship between the refractive index of the transparent resin layer 106 and that of the cone-shaped transparent resin structures 107; the apex angle of the cone-shaped transparent resin structures 107; and the position of the light-emitting point 104 in the organic layer 103.

Next, a relationship among the optimum $\theta_{pri}$ at which efficiency is maximized, the refractive index of the transparent resin layer 106 $n_{LPL}$, and the refractive index of the cone-shaped transparent resin structures 107 $n_{pri}$ will be described.

Figure 6:
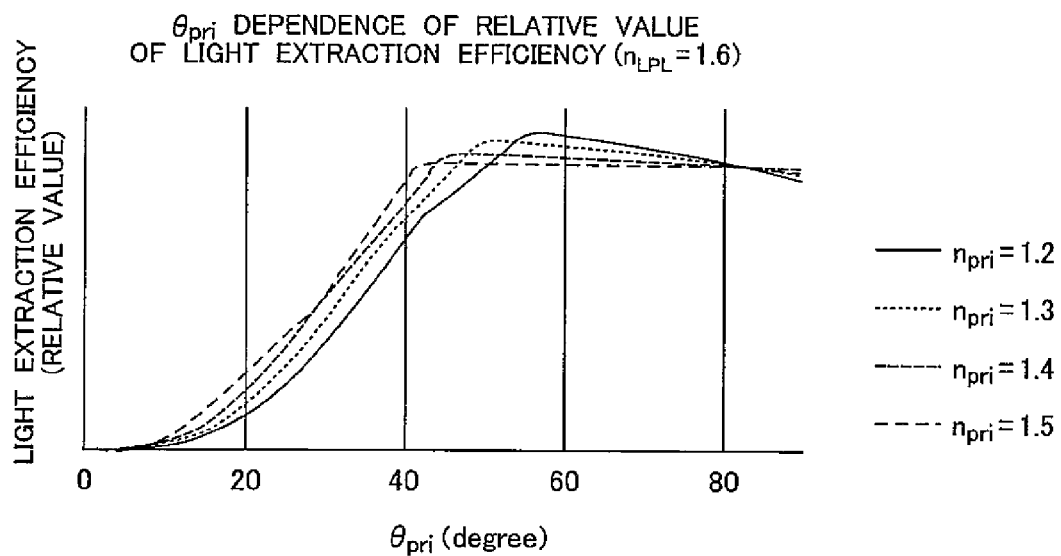
FIG. 6 is a graph showing simulation results of another relationship between $\theta_{pri}$ and light extraction efficiency when $n_{LPL}$ is 1.6 and $\theta_{cof}$ is 36.05° in accordance with the first embodiment of the present invention.
Figure 7:
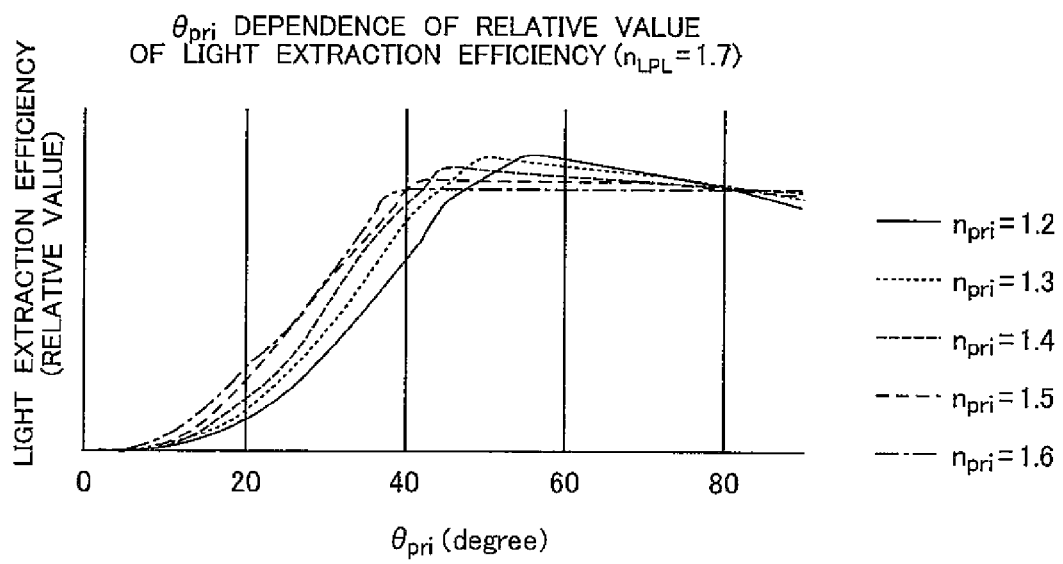
FIG. 7 is a graph showing simulation results of still another relationship between $\theta_{pri}$ and light extraction efficiency in accordance with the first embodiment of the present invention.
Figure 8:
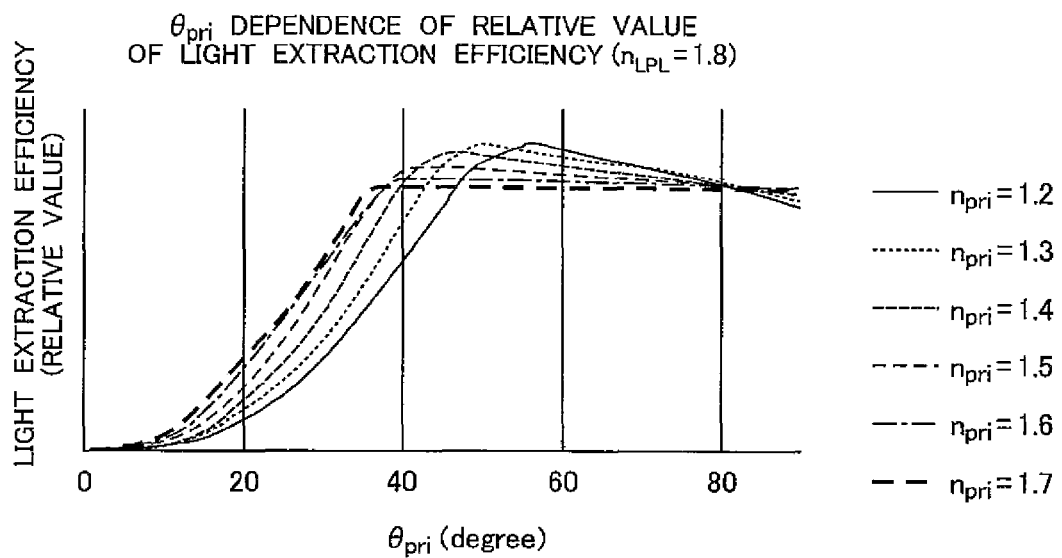
FIG. 8 is a graph showing simulation results of still another relationship between $\theta_{pri}$ and light extraction efficiency in accordance with the first embodiment of the present invention.
Figure 9:
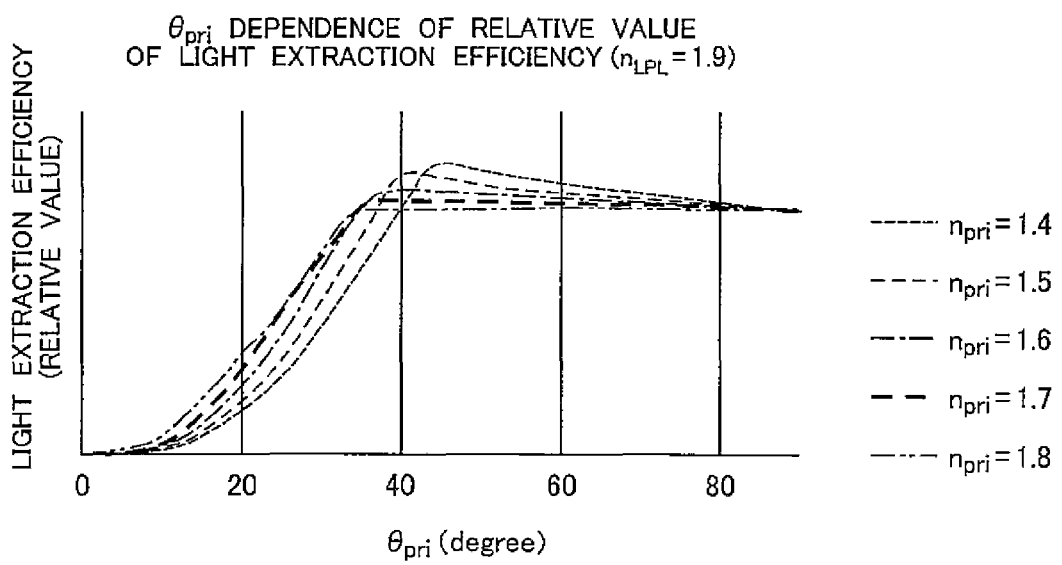
FIG. 9 is a graph showing simulation results of still another relationship between $\theta_{pri}$ and light extraction efficiency in accordance with the first embodiment of the present invention.
Figure 10:
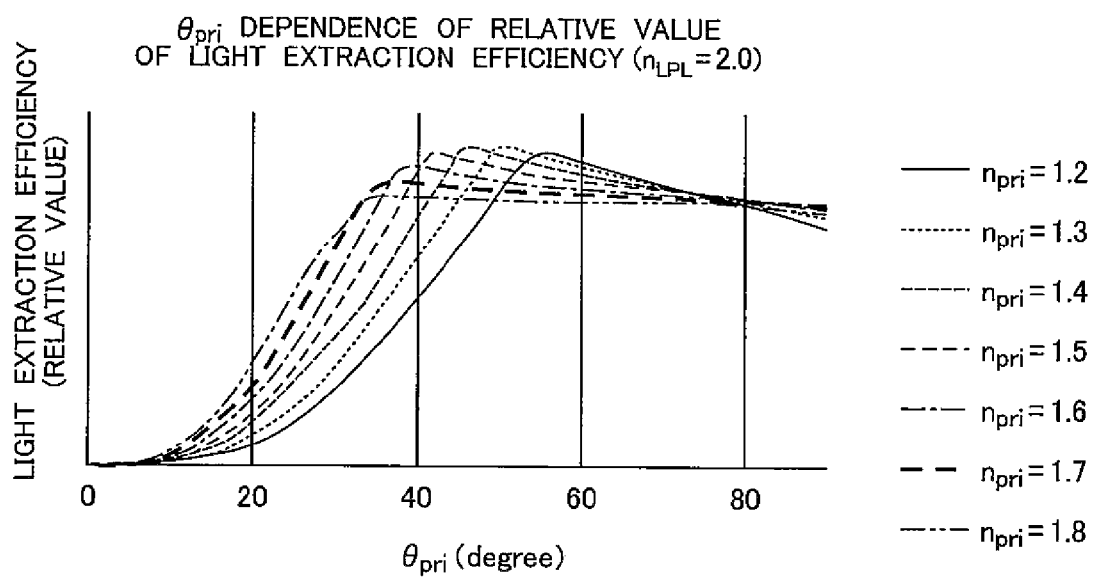
FIG. 10 is a graph showing simulation results of still another relationship between $\theta_{pri}$ and light extraction efficiency in accordance with the first embodiment of the present invention.
Figure 11:
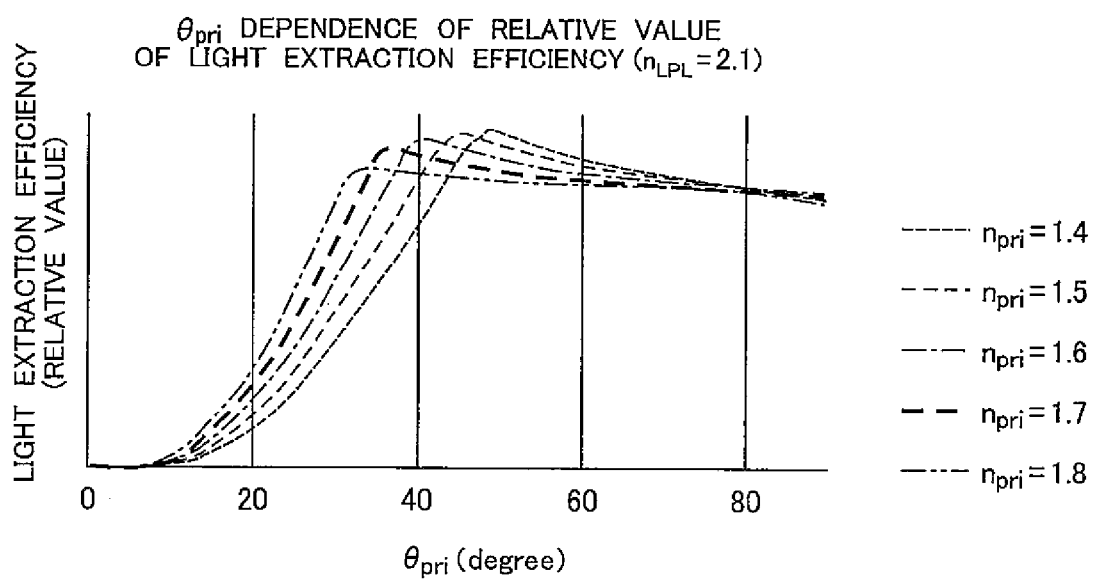
FIG. 11 is a graph showing simulation results of still another relationship between $\theta_{pri}$ and light extraction efficiency in accordance with the first embodiment of the present invention.
Figure 12:
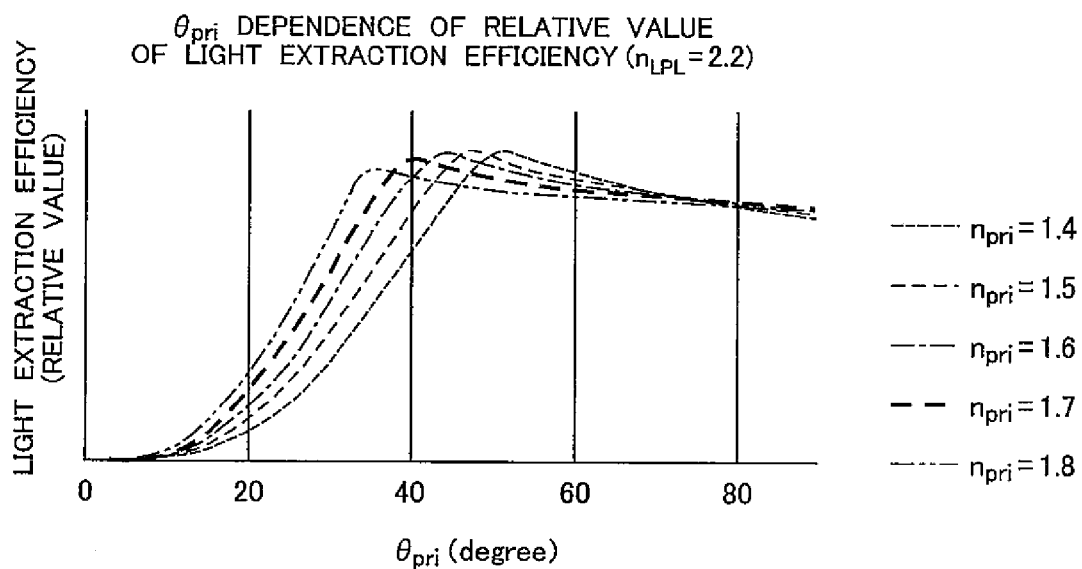
FIG. 12 is a graph showing simulation results of still another relationship between $\theta_{pri}$ and light extraction efficiency in accordance with the first embodiment of the present invention.

FIG. 6 is a graph showing simulation results of another relationship between $\theta_{pri}$ and light extraction efficiency when $n_{LPL}$ is 1.6 and $\theta_{cof}$ is 36.05° in accordance with the first embodiment of the present invention. FIG. 7 is a graph showing simulation results of still another relationship between $\theta_{pri}$ and light extraction efficiency when $n_{LPL}$ is 1.7 and $\theta_{cof}$ is 36.05° in accordance with the present embodiment. FIG. 8 is a graph showing simulation results of still another relationship between $\theta_{pri}$ and light extraction efficiency when $n_{LPL}$ is 1.8 and $\theta_{cof}$ is 36.05° in accordance with the present embodiment. FIG. 9 is a graph showing simulation results of still another relationship between $\theta_{pri}$ and light extraction efficiency when $n_{LPL}$ is 1.9 and $\theta_{cof}$ is 36.05° in accordance with the present embodiment. FIG. 10 is a graph showing simulation results of still another relationship between $\theta_{pri}$ and light extraction efficiency when $n_{LPL}$ is 2.0 and $\theta_{cof}$ is 36.05° in accordance with the present embodiment. FIG. 11 is a graph showing simulation results of still another relationship between $\theta_{pri}$ and light extraction efficiency when $n_{LPL}$ is 2.1 and $\theta_{cof}$ is 36.05° in accordance with the present embodiment. FIG. 12 is a graph showing simulation results of still another relationship between $\theta_{pri}$ and light extraction efficiency when $n_{LPL}$ is 2.2 and $\theta_{cof}$ is 36.05° in accordance with the present embodiment. As shown in FIGS. 6 to 12, the optimum $\theta_{pri}$, at which light extraction efficiency is maximized, greatly depends on the correlation between $n_{LPL}$ and $n_{pri}$.

Figure 13:
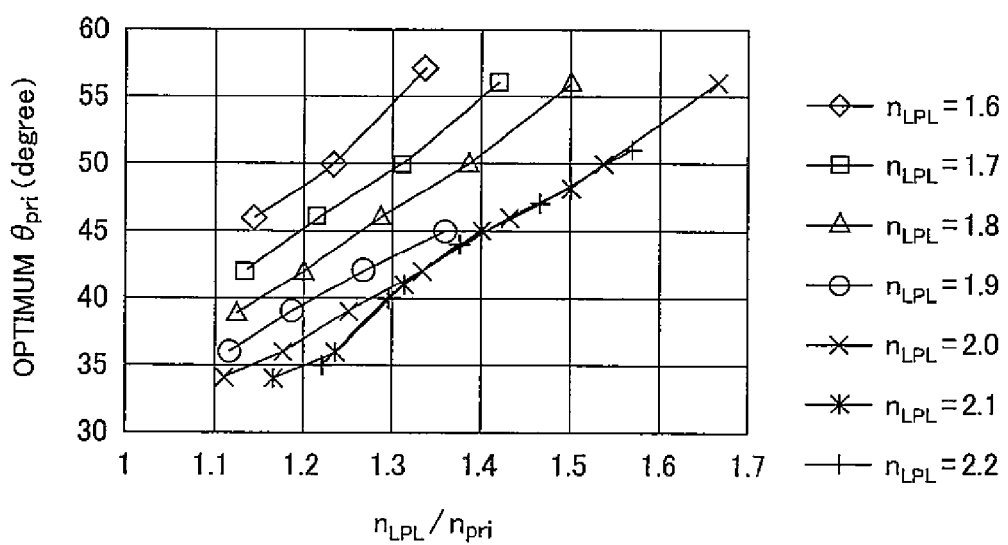
FIG. 13 is a graph showing simulation results of a relationship between half angle of the optimum apex angle "optimum $\theta_{pri}$" (unit: degree) and a ratio of refractive indexes between a transparent resin layer and cone-shaped transparent resin structures "$n_{LPL}/n_{pri}$" in accordance with the first embodiment of the present invention.

FIG. 13 is a graph showing simulation results of a relationship between half angle of the optimum apex angle "optimum $\theta_{pri}$" (unit: degree) and a ratio of refractive indexes between a transparent resin layer and cone-shaped transparent resin structures "$n_{LPL}/n_{pri}$" in accordance with the present embodiment. The relationship is described with respect to each refractive index of the transparent resin layer 106. As shown in FIG. 13, it is revealed that each line on the graph approximates a straight line, and the optimum $\theta_{pri}$ can be expressed as follows:

Optimum $\theta_{pri}$=44.3x−18, when $n_{LPL}$ is 2.2;

Optimum $\theta_{pri}$=44.3x−17.8, when $n_{LPL}$ is 2.1;

Optimum $\theta_{pri}$=39.5x−10.3, when $n_{LPL}$ is 2.0;

Optimum $\theta_{pri}$=37.5x−5.7, when $n_{LPL}$ is 1.9;

Optimum $\theta_{pri}$=45.1x−12, when $n_{LPL}$ is 1.8;

Optimum $\theta_{pri}$=48.9x−13.5, when $n_{LPL}$ is 1.7; and

Optimum $\theta_{pri}$=58x−20.7, when $n_{LPL}$ is 1.6, where $n_{LPL}/n_{pri}$ is x.

Figure 14:
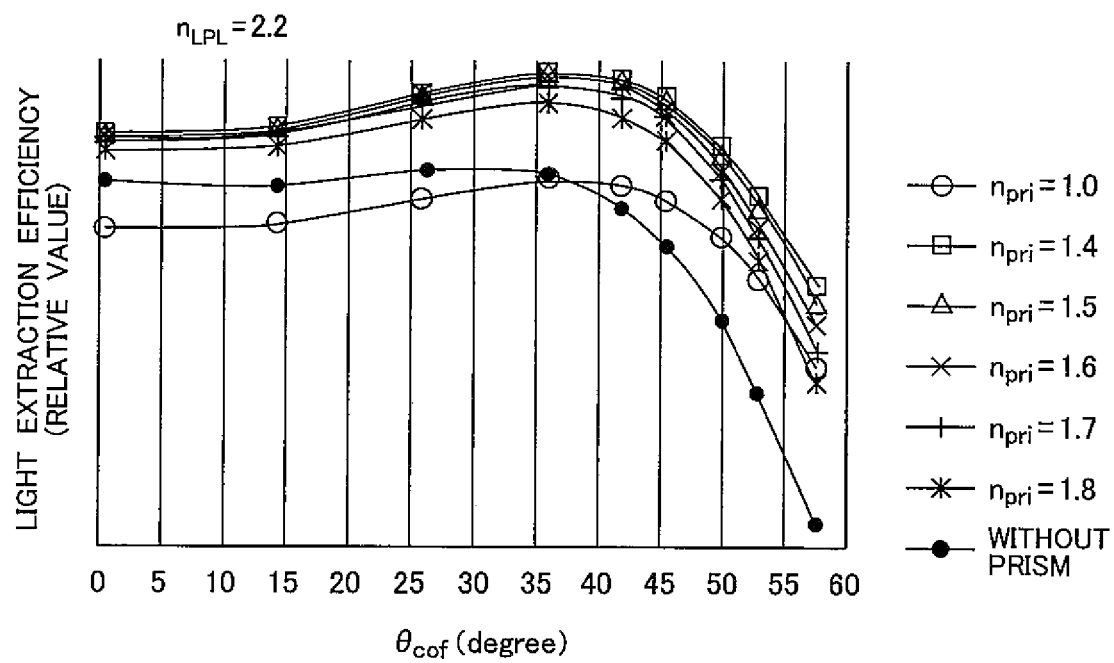
FIG. 14 is graphs respectively showing simulation results of a relationship between light distribution angle with constructive interference $\theta_{cof}$ (unit: degree) and light extraction efficiency (relative value), and of a relationship between $\theta_{cof}$ and optimum $\theta_{pri}$ (unit: degree) in accordance with the first embodiment of the present invention.
Figure 14:
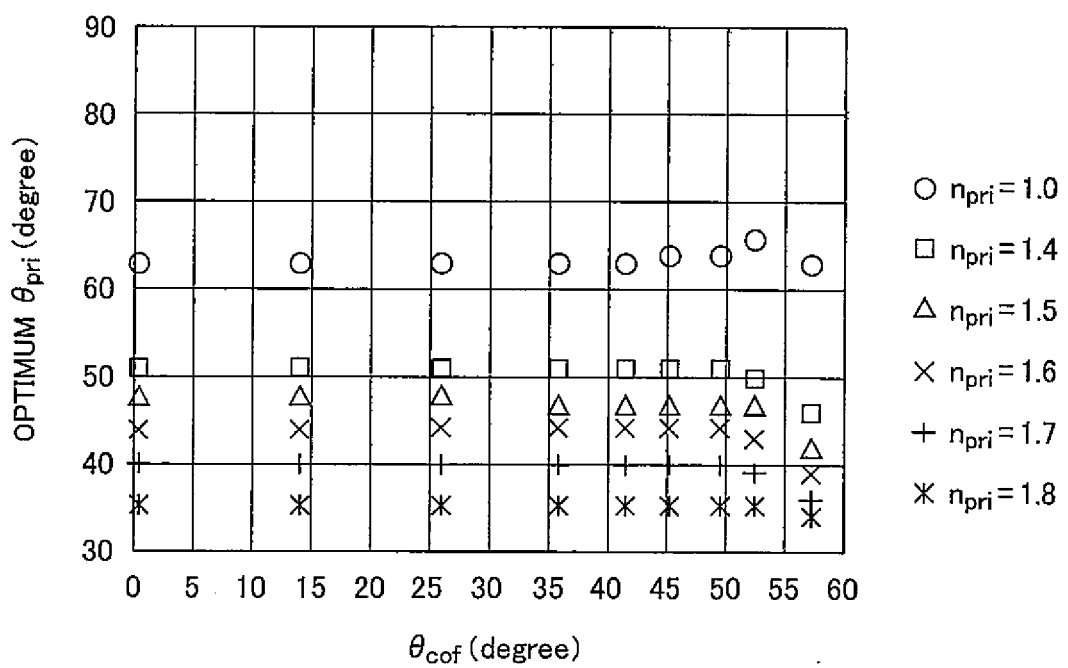

FIG. 14 is graphs respectively showing simulation results of a relationship between light distribution angle with constructive interference $\theta_{cof}$ (unit: degree) and light extraction efficiency (relative value), and of a relationship between $\theta_{cof}$ and optimum $\theta_{pri}$ (unit: degree) in accordance with the present embodiment. The simulations have been carried out under the conditions as follows: A blue-light emitting diode with an emission peak wavelength λ of 460 nm has the organic layer 103 being 150 nm in thickness d and the transparent resin layer 106 with a refractive index $n_{LPL}$ of 2.2. The refractive index of the cone-shaped transparent resin structures 107 $n_{pri}$ is 1.0, 1.4, 1.5, 1.6, 1.7 and 1.8, and the cone-shaped transparent resin structures 107 are not present (without prism). Meanwhile, the emission peak wavelength can be measured by PR-705, a spectroradiometer produced by Photo Research, Inc., for example.

As shown in FIG. 14, in the case that the cone-shaped transparent resin structures 107 are not present, the relative value of light extraction efficiency reaches its peak value when $\theta_{cof}$ is about 30°. The relative value of light extraction efficiency reaches any value above this value when:

$\theta_{cof}$ is in the range from about 0° to 53° with $n_{pri}$ at 1.4;
$\theta_{cof}$ is in the range from about 0° to 51° with $n_{pri}$ at 1.5;
$\theta_{cof}$ is in the range from about 0° to 50° with $n_{pri}$ at 1.6;
$\theta_{cof}$ is in the range from about 0° to 49° with $n_{pri}$ at 1.7; and
$\theta_{cof}$ is in the range from about 0° to 48° with $n_{pri}$ at 1.8.

Furthermore, the relative value of light extraction efficiency becomes high with $\theta_{cof}$ in the range from 30° to 46° and reaches its peak value with $\theta_{cof}$ at 36.05°. In addition, when solved for "a", Eq. 1 indicates that the range of "a" which corresponds to $\theta_{cof}$ in the range from about 30° to 46° is from 0.56 to 0.70. And, the distance from the electrode interface to the center of the light-emitting point 104 is in the range from 84 to 104.7 nm when the thickness of the organic layer 103 is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 51° with $n_{pri}$ at 1.4;
$\theta_{pri}$ is about 47° with $n_{pri}$ at 1.5;
$\theta_{pri}$ is about 44° with $n_{pri}$ at 1.6;
$\theta_{pri}$ is about 40° with $n_{pri}$ at 1.7; and
$\theta_{pri}$ is about 35° with $n_{pri}$ at 1.8.

On the other hand, when $n_{pri}$ is 1, there is no discernible improvement in light extraction efficiency as compared to when the cone-shaped transparent resin structures 107 are not present. Herein, $n_{pri}$ at 1 means that the cone-shaped transparent resin structures 107 are cone-shaped air or vacuum hollow structures.

As described so far, it is revealed that when $n_{LPL}$ is not less than 2.15 and not more than 2.25, light extraction efficiency can be improved by satisfying the following relationship:

The cross-sectional apex angle (unit: degree) of the cone-shaped transparent resin structures 107 $2\theta_{pri}$ in the normal direction of the glass substrate 101 is equal to "2(44.3x−18±5)", i.e., "$2\theta_{pri}$=2(44.3x−18±5)", where $n_{LPL}/n_{pri}$ is x.

It is also revealed that light extraction efficiency can be improved by satisfying the following relationship:

"(2m−155/180)λ/4/n/(cos 30°)≦ad≦(2m−155/180)λ/4/n/(cos 46°)", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1)); "n" represents the refractive index of the organic layer 103; and "m" represents an integer equal to 1 or greater.

Figure 15:
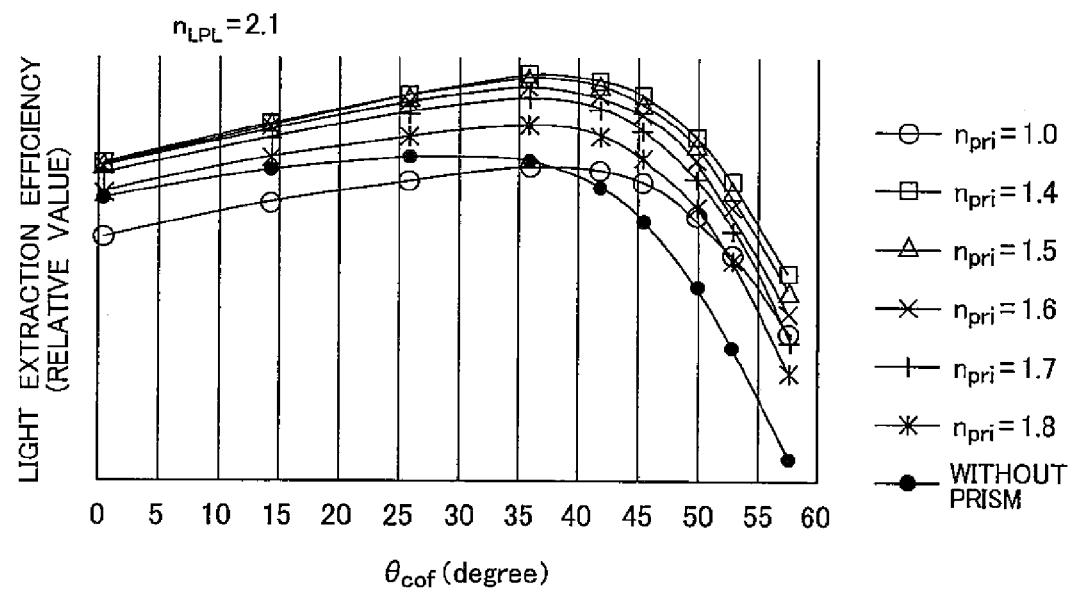
FIG. 15 is graphs respectively showing simulation results of another relationship between $\theta_{cof}$ (unit: degree) and light extraction efficiency (relative value), and of another relationship between $\theta_{cof}$ and optimum $\theta_{pri}$ (unit: degree) in accordance with the first embodiment of the present invention.
Figure 15:
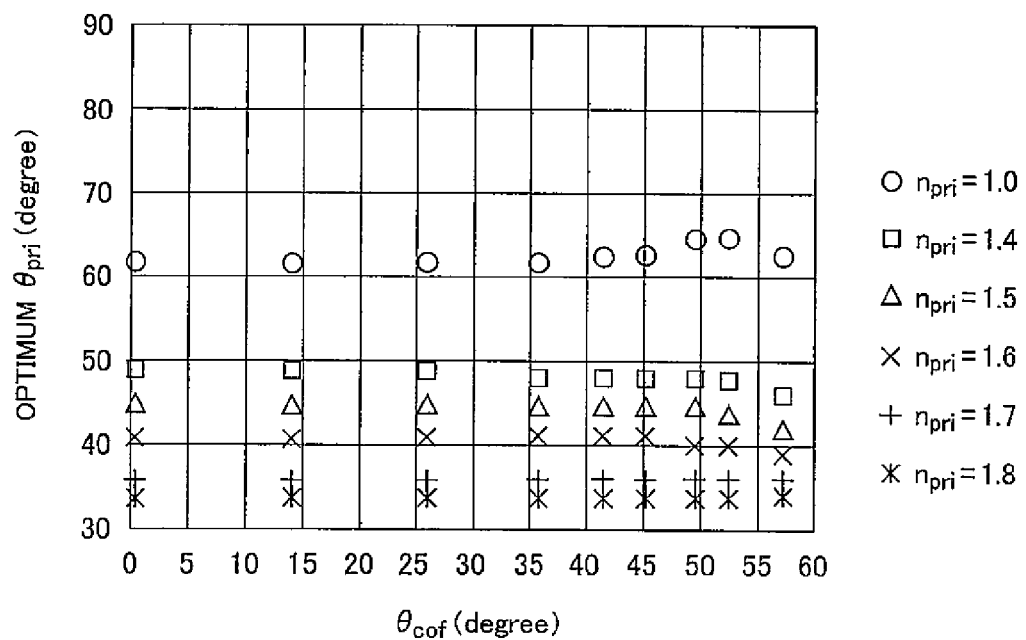

FIG. 15 is graphs respectively showing simulation results of another relationship between $\theta_{cof}$ (unit: degree) and light extraction efficiency (relative value), and of another relationship between $\theta_{cof}$ and optimum $\theta_{pri}$ (unit: degree) in accordance with the present embodiment. The simulations have been carried out under the conditions that are identical to those in FIG. 14 except that the refractive index of the transparent resin layer 106 $n_{LPL}$ is 2.1.

As shown in FIG. 15, in the case that the cone-shaped transparent resin structures 107 are not present, the relative value of light extraction efficiency reaches its peak value when $\theta_{cof}$ is about 30°. The relative value of light extraction efficiency reaches any value above this value when:

$\theta_{cof}$ is in the range from about 2° to 51° with $n_{pri}$ at 1.4;
$\theta_{cof}$ is in the range from about 2° to 50° with $n_{pri}$ at 1.5;
$\theta_{cof}$ is in the range from about 4° to 49° with $n_{pri}$ at 1.6;
$\theta_{cof}$ is in the range from about 6° to 47° with $n_{pri}$ at 1.7; and
$\theta_{cof}$ is in the range from about 14° to 45° with $n_{pri}$ at 1.8.

Furthermore, the relative value of light extraction efficiency becomes high with $\theta_{cof}$ in the range from 30° to 43° and reaches its peak value with $\theta_{cof}$ at 36.05°. In addition, when solved for "a", Eq. 1 indicates that the range of "a" which corresponds to $\theta_{cof}$ in the range from about 30° to 43° is from 0.56 to 0.66. And, the distance from the electrode interface to the center of the light-emitting point 104 is in the range from 84 to 99.5 nm when the thickness of the organic layer 103 "d" is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 48° with $n_{pri}$ at 1.4;
$\theta_{pri}$ is about 45° with $n_{pri}$ at 1.5;
$\theta_{pri}$ is about 41° with $n_{pri}$ at 1.6;
$\theta_{pri}$ is about 36° with $n_{pri}$ at 1.7; and
$\theta_{pri}$ is about 34° with $n_{pri}$ at 1.8.

On the other hand, when $n_{pri}$ is 1, there is no discernible improvement in light extraction efficiency as compared to when the cone-shaped transparent resin structures 107 are not present.

As described above, it is revealed that when $n_{LPL}$ is not less than 2.05 and not more than 2.15, light extraction efficiency can be improved by satisfying the following relationship:

"$2\theta_{pri}=2(44.3x-17.8\pm5)$", where $n_{LPL}/n_{pri}$ is $x$.

It is also revealed that light extraction efficiency can be improved by satisfying the following relationship:

"$(2m-155/180)\lambda/4/n/(\cos 30°)\leq ad\leq (2m-155/180)\lambda/4/n/(\cos 43°)$", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1)); "n" represents the refractive index of the organic layer 103; and "m" represents an integer equal to 1 or greater.

Figure 16:
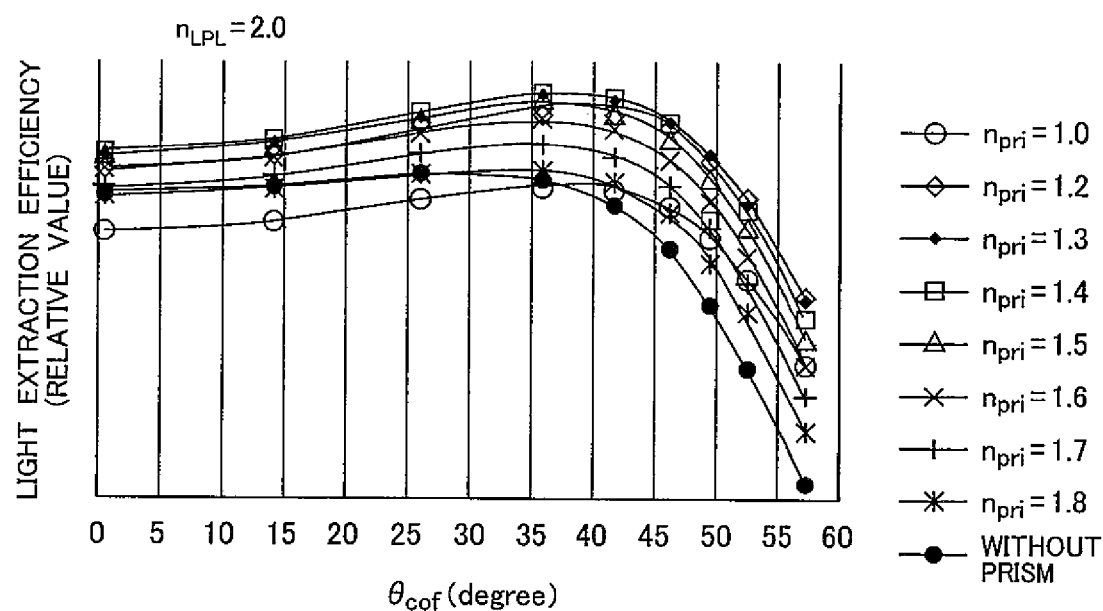
FIG. 16 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the first embodiment of the present invention.
Figure 16:
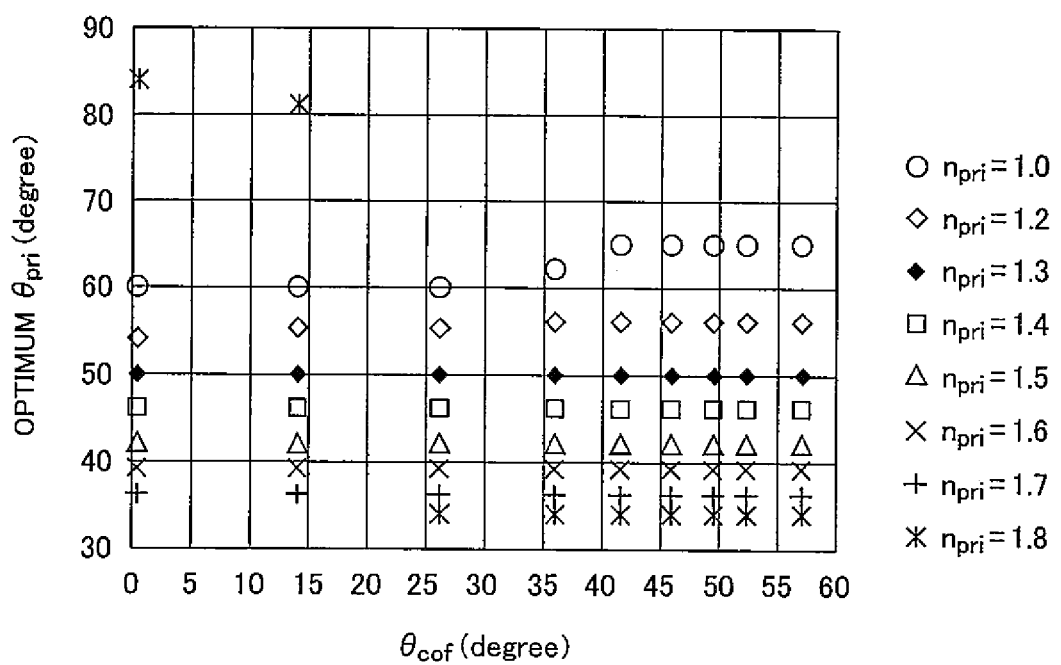

FIG. 16 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the present embodiment. The simulations have been carried out under the conditions as follows: The refractive index of the transparent resin layer 106 $n_{LPL}$ is 2.0. The refractive index of the cone-shaped transparent resin structures 107 $n_{pri}$ is 1.0, 1.2, 1.3, 1.4, 1.5, 1.6, 1.7 and 1.8, and the cone-shaped transparent resin structures 107 are not present (without prism). The other conditions are identical to those in FIG. 14.

As shown in FIG. 16, in the case that the cone-shaped transparent resin structures 107 are not present, the relative value of light extraction efficiency reaches its peak value when $\theta_{cof}$ is about 29°. The relative value of light extraction efficiency reaches any value above this value when:

$\theta_{cof}$ is in the range from about 0° to 51° with $n_{pri}$ at 1.2;
$\theta_{cof}$ is in the range from about 0° to 51° with $n_{pri}$ at 1.3;
$\theta_{cof}$ is in the range from about 0° to 51° with $n_{pri}$ at 1.4;
$\theta_{cof}$ is in the range from about 0° to 49° with $n_{pri}$ at 1.5;
$\theta_{cof}$ is in the range from about 0° to 47° with $n_{pri}$ at 1.6;
$\theta_{cof}$ is in the range from about 16° to 44° with $n_{pri}$ at 1.7; and
$\theta_{cof}$ is in the range from about 28° to 38° with $n_{pri}$ at 1.8.

Furthermore, the relative value of light extraction efficiency becomes high with $\theta_{cof}$ in the range from 30° to 45° and reaches its peak value with $\theta_{cof}$ at 36.05°. In addition, when solved for "a", Eq. 1 indicates that the range of "a" which corresponds to $\theta_{cof}$ in the range from about 30° to 45° is from 0.56 to 0.69. And, the distance from the electrode interface to the center of the light-emitting point 104 is in the range from 84 to 102.9 nm when the thickness of the organic layer 103 "d" is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 56° with $n_{pri}$ at 1.2;
$\theta_{pri}$ is about 50° with $n_{pri}$ at 1.3;
$\theta_{pri}$ is about 46° with $n_{pri}$ at 1.4;
$\theta_{pri}$ is about 42° with $n_{pri}$ at 1.5;
$\theta_{pri}$ is about 39° with $n_{pri}$ at 1.6;
$\theta_{pri}$ is about 36° with $n_{pri}$ at 1.7; and
$\theta_{pri}$ is about 34° with $n_{pri}$ at 1.8.

On the other hand, when $n_{pri}$ is 1, there is no discernible improvement in light extraction efficiency as compared to when the cone-shaped transparent resin structures 107 are not present.

As described above, it is revealed that when $n_{LPL}$ is not less than 1.95 and not more than 2.05, light extraction efficiency can be improved by satisfying the following relationship:

"$2\theta_{pri}=2(39.5x-10.3\pm5)$", where $n_{LPL}/n_{pri}$ is $x$.

It is also revealed that light extraction efficiency can be improved by satisfying the following relationship:

"$(2m-155/180)\lambda/4/n/(\cos 30°)\leq ad\leq (2m-155/180)\lambda/4/n/(\cos 45°)$", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1)); "n" represents the refractive index of the organic layer 103; and "m" represents an integer equal to 1 or greater.

Figure 17:
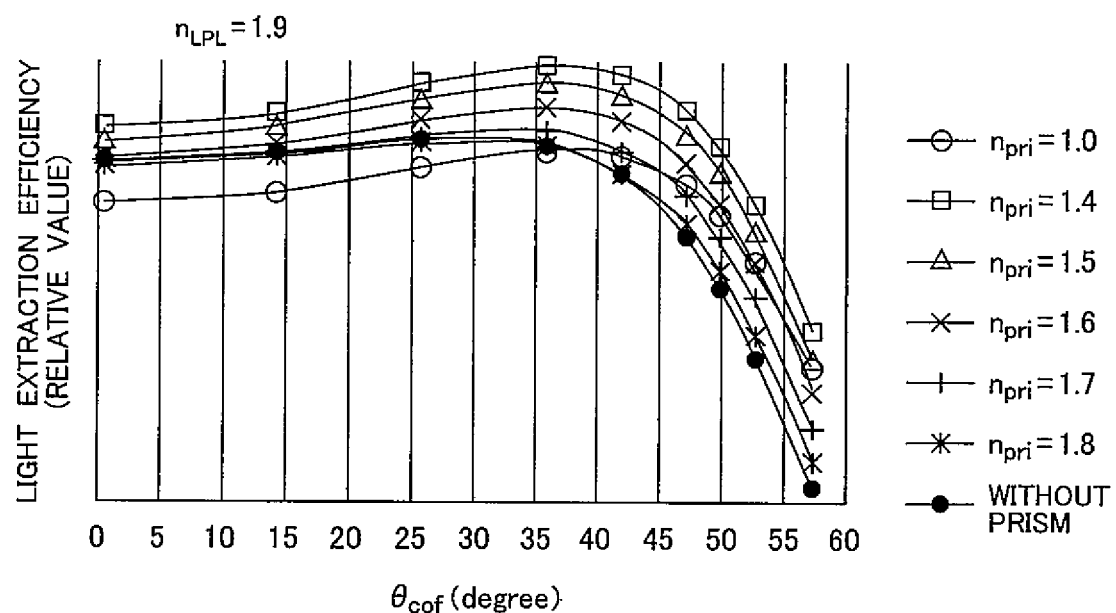
FIG. 17 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the first embodiment of the present invention.
Figure 17:
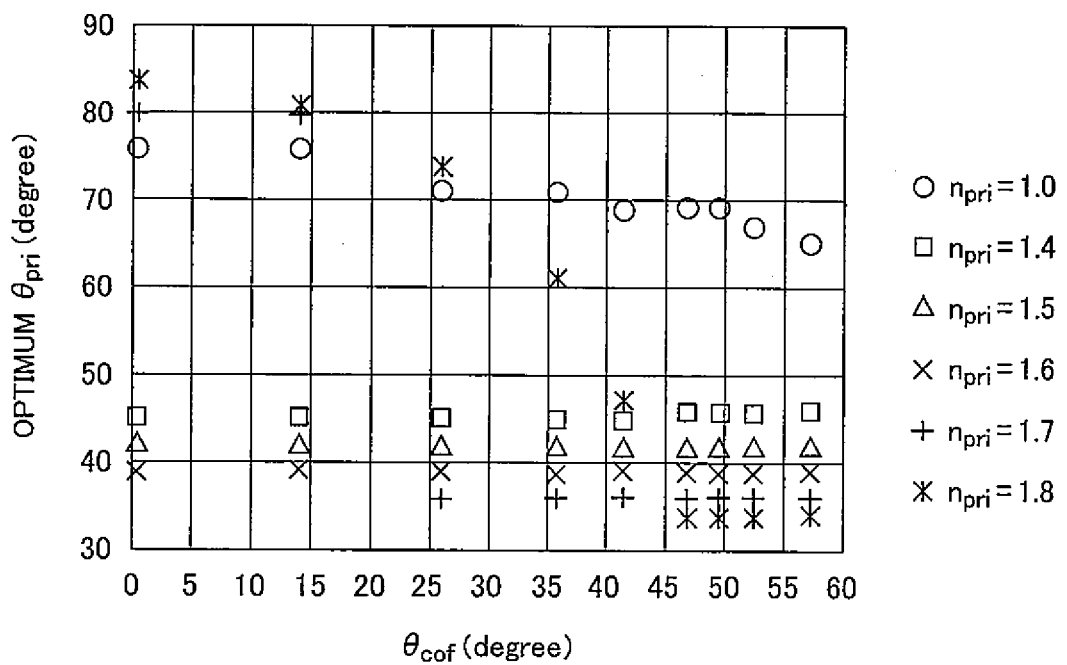

FIG. 17 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the present embodiment. The simulations have been carried out under the conditions that are identical to those in FIG. 14 except that the refractive index of the transparent resin layer 106 $n_{LPL}$ is 1.9.

As shown in FIG. 17, in the case that the cone-shaped transparent resin structures 107 are not present, the relative value of light extraction efficiency reaches its peak value when $\theta_{cof}$ is about 27.6°. The relative value of light extraction efficiency reaches any value above this value when:

$\theta_{cof}$ is in the range from about 0° to 49° with $n_{pri}$ at 1.4;
$\theta_{cof}$ is in the range from about 3° to 47° with $n_{pri}$ at 1.5;
$\theta_{cof}$ is in the range from about 17° to 44° with $n_{pri}$ at 1.6; and
$\theta_{cof}$ is in the range from about 28° to 38° with $n_{pri}$ at 1.7.

Furthermore, the relative value of light extraction efficiency becomes high with $\theta_{cof}$ in the range from 28° to 43° and reaches its peak value with $\theta_{cof}$ at 36.05°. In addition, when solved for "a", Eq. 1 indicates that the range of "a" which corresponds to $\theta_{cof}$ in the range from about 28° to 43° is from 0.55 to 0.66. And, the distance from the electrode interface to the center of the light-emitting point 104 is in the range from 82.4 to 99.5 nm when the thickness of the organic layer 103 "d" is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 45° with $n_{pri}$ at 1.4;
$\theta_{pri}$ is about 42° with $n_{pri}$ at 1.5;
$\theta_{pri}$ is about 39° with $n_{pri}$ at 1.6; and
$\theta_{pri}$ is about 36° with $n_{pri}$ at 1.7.

On the other hand, in the cases that $n_{pri}$ is 1 and 1.8, there is no discernible improvement in light extraction efficiency as compared to when the cone-shaped transparent resin structures 107 are not present.

As described above, it is revealed that when $n_{LPL}$ is not less than 1.85 and not more than 1.95, light extraction efficiency can be improved by satisfying the following relationship:

"$2\theta_{pri}=2(37.5x-5.7\pm5)$", where $n_{LPL}/n_{pri}$ is x.

It is also revealed that light extraction efficiency can be improved by satisfying the following relationship:

"$(2m-155/180)\lambda/4/n/(\cos 28°) \leq ad \leq (2m-155/180)44/n/(\cos 43°)$", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1)); "n" represents the refractive index of the organic layer 103; and "m" represents an integer equal to 1 or greater.

Figure 18:
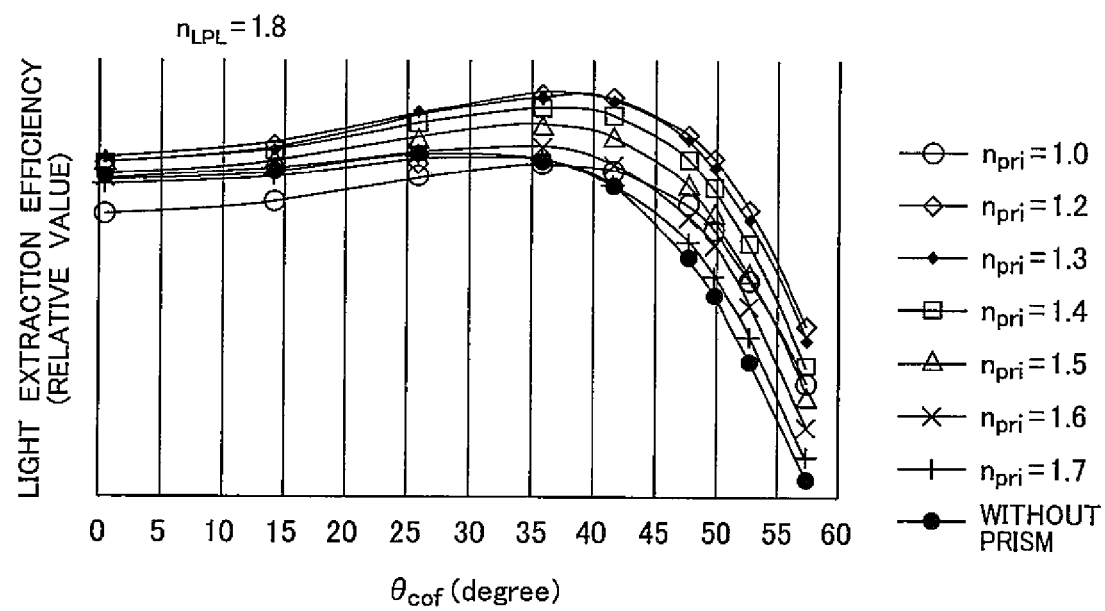
FIG. 18 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the first embodiment of the present invention.
Figure 18:
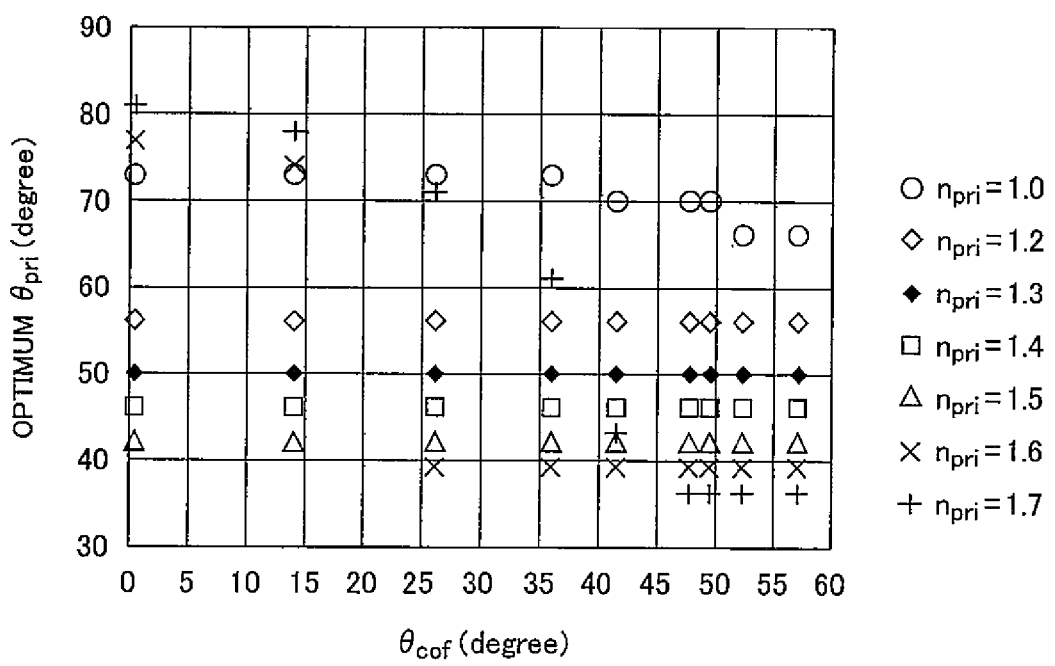

FIG. 18 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the present embodiment. The simulations have been carried out under the conditions as follows: The refractive index of the transparent resin layer 106 $n_{LPL}$ is 1.8. The refractive index of the cone-shaped transparent resin structures 107 $n_{pri}$ is 1.0, 1.2, 1.3, 1.4, 1.5, 1.6 and 1.7, and the cone-shaped transparent resin structures 107 are not present (without prism). The other conditions are identical to those in FIG. 14.

As shown in FIG. 18, in the case that the cone-shaped transparent resin structures 107 are not present, the relative value of light extraction efficiency reaches its peak value when $\theta_{cof}$ is about 27°. The relative value of light extraction efficiency reaches any value above this value when:

$\theta_{cof}$ is in the range from about 6° to 49° with $n_{pri}$ at 1.2;
$\theta_{cof}$ is in the range from about 2° to 49° with $n_{pri}$ at 1.3;
$\theta_{cof}$ is in the range from about 9° to 47° with $n_{pri}$ at 1.4;
$\theta_{cof}$ is in the range from about 18° to 43° with $n_{pri}$ at 1.5; and
$\theta_{cof}$ is in the range from about 27° to 38° with $n_{pri}$ at 1.6.

Furthermore, the relative value of light extraction efficiency becomes high with $\theta_{cof}$ in the range from 28° to 44° and reaches its peak value with $\theta_{cof}$ at 36.05°. In addition, when solved for "a", Eq. 1 indicates that the range of "a" which corresponds to $\theta_{cof}$ in the range from about 28° to 44° is from 0.55 to 0.67. And, the distance from the electrode interface to the center of the light-emitting point 104 is in the range from 82.4 to 101.2 nm when the thickness of the organic layer 103 "d" is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 56° with $n_{pri}$ at 1.2;
$\theta_{pri}$ is about 50° with $n_{pri}$ at 1.3;
$\theta_{pri}$ is about 46° with $n_{pri}$ at 1.4;
$\theta_{pri}$ is about 42° with $n_{pri}$ at 1.5; and
$\theta_{pri}$ is about 39° with $n_{pri}$ at 1.6.

On the other hand, in the cases that $n_{pri}$ is 1 and 1.7, there is no discernible improvement in light extraction efficiency as compared to when the cone-shaped transparent resin structures 107 are not present.

As described above, it is revealed that when $n_{LPL}$ is not less than 1.75 and not more than 1.85, light extraction efficiency can be improved by satisfying the following relationship:

"$2\theta_{pri}=2(45.1x-12\pm5)$", where $n_{LPL}/n_{pri}$ is x.

It is also revealed that light extraction efficiency can be improved by satisfying the following relationship:

"$(2m-155/180)\lambda/4/n/(\cos 28°) \leq ad \leq (2m-155/180)\lambda/4/n/(\cos 44°)$", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1)); "n" represents the refractive index of the organic layer 103; and "m" represents an integer equal to 1 or greater.

Figure 19:
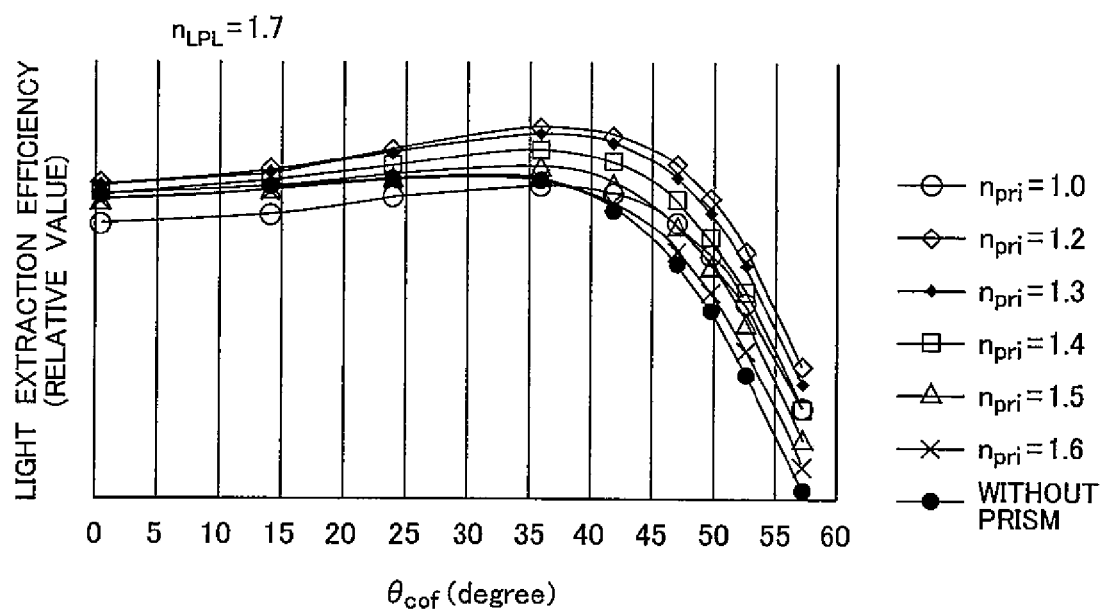
FIG. 19 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the first embodiment of the present invention.
Figure 19:
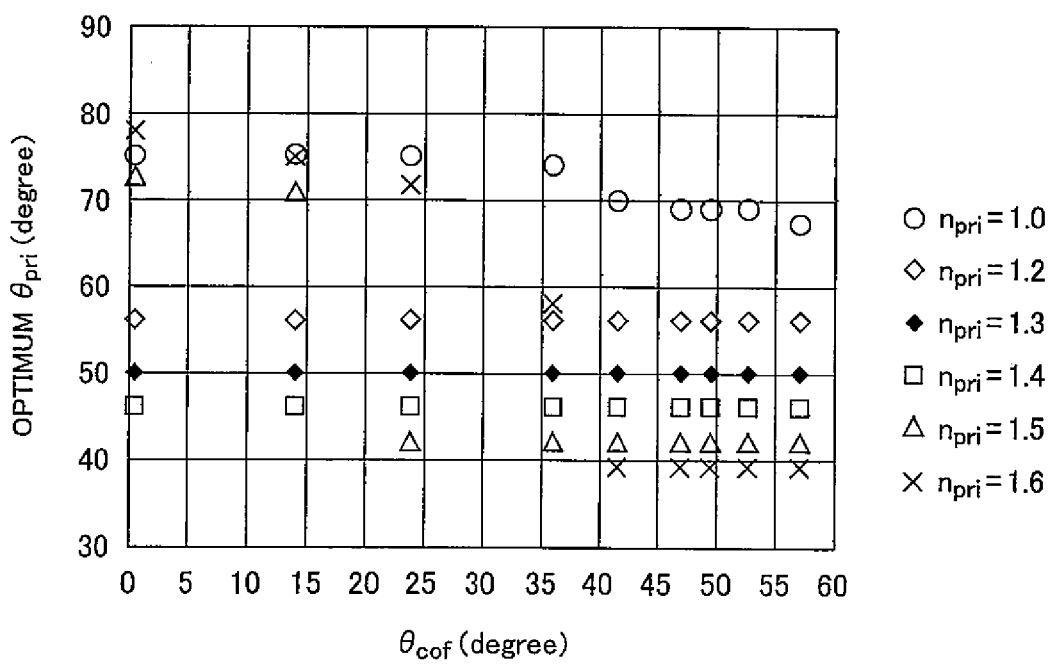

FIG. 19 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the present embodiment. The simulations have been carried out under the conditions as follows: The refractive index of the transparent resin layer 106 $n_{LPL}$ is 1.7. The refractive index of the cone-shaped transparent resin structures 107 $n_{pri}$ is 1.0, 1.2, 1.3, 1.4, 1.5 and 1.6, and the cone-shaped transparent resin structures 107 are not present (without prism). The other conditions are identical to those in FIG. 14.

As shown in FIG. 19, in the case that the cone-shaped transparent resin structures 107 are not present, the relative value of light extraction efficiency reaches its peak value when $\theta_{cof}$ is about 26°. The relative value of light extraction efficiency reaches any value above this value when:

$\theta_{cof}$ is in the range from about 8° to 48° with $n_{pri}$ at 1.2;
$\theta_{cof}$ is in the range from about 10° to 47° with $n_{pri}$ at 1.3;
$\theta_{cof}$ is in the range from about 17° to 44° with $n_{pri}$ at 1.4; and
$\theta_{cof}$ is in the range from about 24° to 39° with $n_{pri}$ at 1.5.

Furthermore, the relative value of light extraction efficiency becomes high with $\theta_{cof}$ in the range from 26° to 44° and reaches its peak value with $\theta_{cof}$ at 36.05°. In addition, when solved for "a", Eq. 1 indicates that the range of "a" which corresponds to $\theta_{cof}$ in the range from about 26° to 44° is from 0.54 to 0.67. And, the distance from the electrode interface to the center of the light-emitting point 104 is in the range from 81 to 101.2 nm when the thickness of the organic layer 103 "d" is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 56° with $n_{pri}$ at 1.2;
$\theta_{pri}$ is about 50° with $n_{pri}$ at 1.3;
$\theta_{pri}$ is about 46° with $n_{pri}$ at 1.4; and
$\theta_{pri}$ is about 42° with $n_{pri}$ at 1.5.

On the other hand, in the cases that $n_{pri}$ is 1 and 1.6, there is no discernible improvement in light extraction efficiency as compared to when the cone-shaped transparent resin structures 107 are not present.

As described above, it is revealed that when $n_{LPL}$ is not less than 1.65 and not more than 1.75, light extraction efficiency can be improved by satisfying the following relationship:

"$2\theta_{pri}=2(48.9x-13.5\pm5)$", where $n_{LPL}/n_{pri}$ is x.

It is also revealed that light extraction efficiency can be improved by satisfying the following relationship:

"$(2m-155/180)\lambda/4/n/(\cos 26°) \leq ad \leq (2m-155/180)\lambda/4/n/(\cos 44°)$", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1); "n" represents the refractive index of the organic layer 103; and "m" represents an integer equal to 1 or greater.

Figure 20:
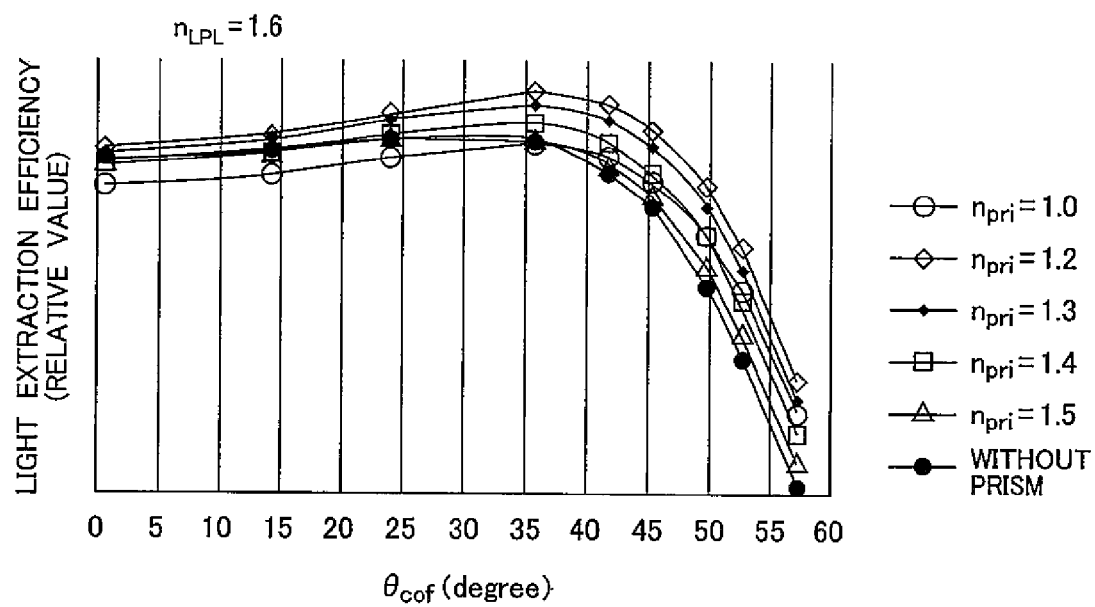
FIG. 20 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the first embodiment of the present invention.
Figure 20:
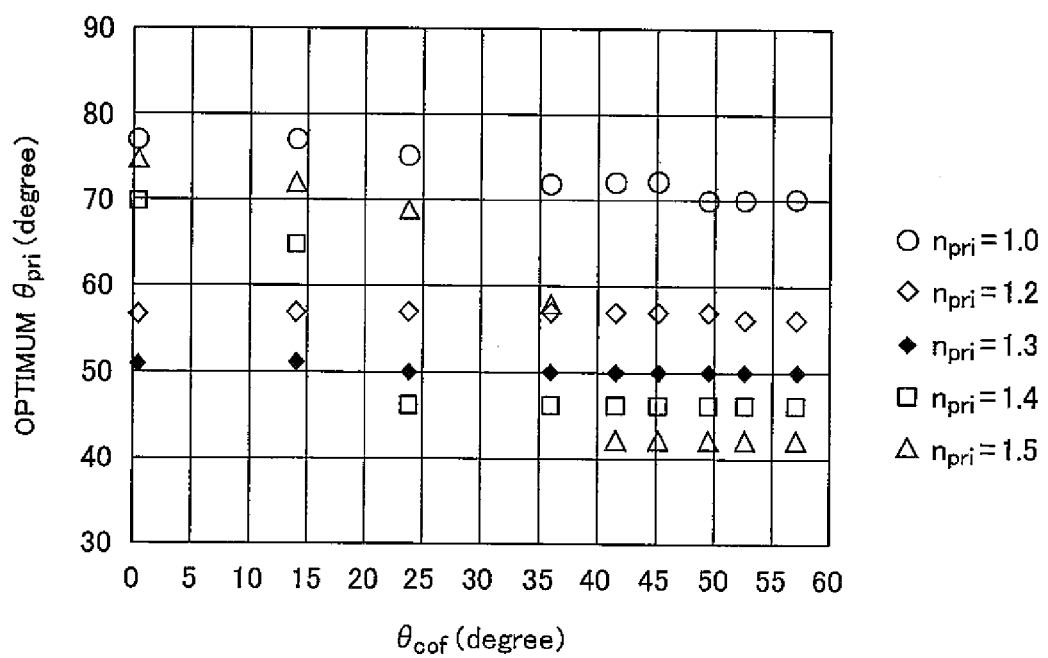

FIG. 20 is graphs respectively showing simulation results of still another relationship between $\theta_{cof}$ (unit: degree) and light extraction efficiency (relative value), and of still another relationship between $\theta_{cof}$ and optimum $\theta_{pri}$ (unit: degree) in accordance with the present embodiment. The simulations have been carried out under the conditions as follows: The refractive index of the transparent resin layer 106 $n_{LPL}$ is 1.6. The refractive index of the cone-shaped transparent resin structures 107 $n_{pri}$ is 1.0, 1.2, 1.3, 1.4 and 1.5, and the cone-shaped transparent resin structures 107 are not present (without prism). The other conditions are identical to those in FIG. 14.

As shown in FIG. 20, in the case that the cone-shaped transparent resin structures 107 are not present, the relative value of light extraction efficiency reaches its peak value when $\theta_{cof}$ is about 24°. The relative value of light extraction efficiency reaches any value above this value when:

$\theta_{cof}$ is in the range from about 12° to 46° with $n_{pri}$ at 1.2;
$\theta_{cof}$ is in the range from about 16° to 44° with $n_{pri}$ at 1.3; and
$\theta_{cof}$ is in the range from about 22° to 40° with $n_{pri}$ at 1.4.

Furthermore, the relative value of light extraction efficiency becomes high with $\theta_{cof}$ in the range from 24° to 43° and reaches its peak value with $\theta_{cof}$ at 36.05°. In addition, when solved for "a", Eq. 1 indicates that the range of "a" which corresponds to $\theta_{cof}$ in the range from about 24° to 43° is from 0.53 to 0.66. And, the distance from the electrode interface to the center of the light-emitting point 104 is in the range from 79.6 to 99.5 nm when the thickness of the organic layer 103 "d" is 150 nm.

Moreover, within the range of $\theta_{cof}$ at which light extraction efficiency becomes higher than when the cone-shaped transparent resin structures 107 are not present, light extraction efficiency reaches its peak value when:

$\theta_{pri}$ is about 57° with $n_{pri}$ at 1.2;
$\theta_{pri}$ is about 50° with $n_{pri}$ at 1.3; and
$\theta_{pri}$ is about 46° with $n_{pri}$ at 1.4.

On the other hand, in the cases that $n_{pri}$ is 1 and 1.5, there is no discernible improvement in light extraction efficiency as compared to when the cone-shaped transparent resin structures 107 are not present.

As described above, it is revealed that when $n_{LPL}$ is not less than 1.55 and not more than 1.65, light extraction efficiency can be improved by satisfying the following relationship:

"$2\theta_{pri}=2(58x-20.7\pm5)$", where $n_{LPL}/n_{pri}$ is x.

It is also revealed that light extraction efficiency can be improved by satisfying the following relationship:

"$(2m-155/180)\lambda/4/n/(\cos 24°) \leq ad \leq (2m-155/180)\lambda/4/n/(\cos 43°)$", where "ad" represents the height from the interface between the reflective electrode 102 and the organic layer 103 to the light-emitting point 104 ("d" (unit: nm) represents the thickness of the organic layer 103, and "a" represents a value more than 0 but less than 1 (0<a<1); "n" represents the refractive index of the organic layer 103; and "m" represents an integer equal to 1 or greater.

In summary, light extraction efficiency can be improved as compared to when the cone-shaped resin structures 107 are not present by appropriately setting interference conditions and controlling the relationship between $n_{LPL}$, which is the refractive index of the transparent resin layer 106, and $n_{pri}$, which is the refractive index of the cone-shaped transparent resin structures 107.

Figure 21:
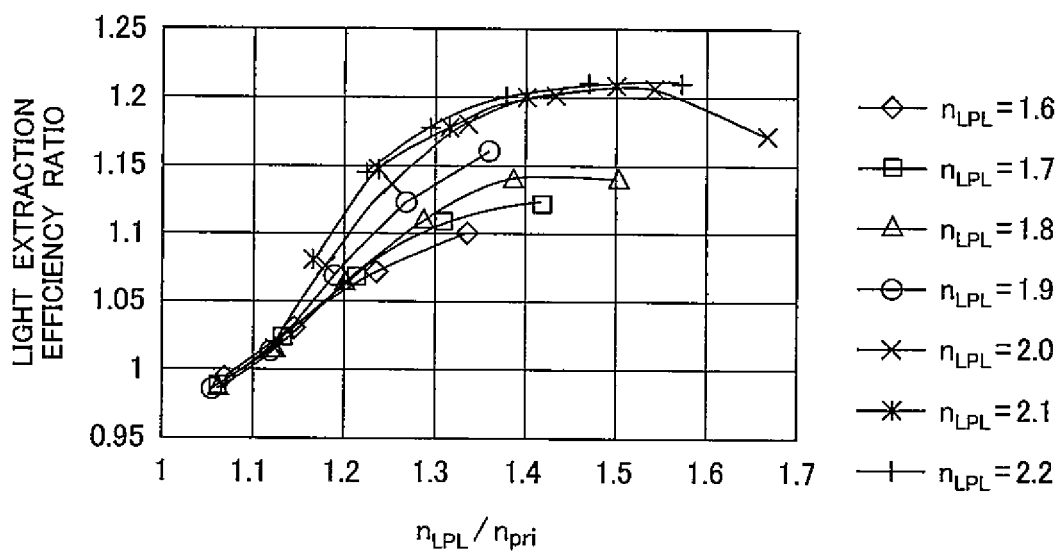
FIG. 21 is a graph showing a relationship between light extraction efficiency ratio and refractive index ratio $n_{LPL}/n_{pri}$ when $\theta_{cof}$ is 36.05° in accordance with the first embodiment of the present invention.

FIG. 21 is a graph showing a relationship between light extraction efficiency ratio and refractive index ratio $n_{LPL}/n_{pri}$ when $\theta_{cof}$ is 36.05° in accordance with the first embodiment of the present invention. Herein, the light extraction efficiency ratio is a ratio of the light extraction efficiency normalized by the maximized light extraction efficiency when the cone-shaped transparent resin structures 107 are not present. So, any value larger than 1 on the vertical axis of the graph indicates that light extraction efficiency has been improved by providing the cone-shaped resin structures 107. However, this graph does not include any value when the refractive index of the cone-shaped transparent resin structures 107 is 1. As shown in FIG. 21, it is revealed that $n_{LPL}/n_{pri}$, which is the ratio between the refractive index of the transparent resin layer 106 and that of the cone-shaped transparent resin structures 107, needs to be set at 1.1 or higher, preferably not less than 1.3 and not more than 1.6.

Figure 22:
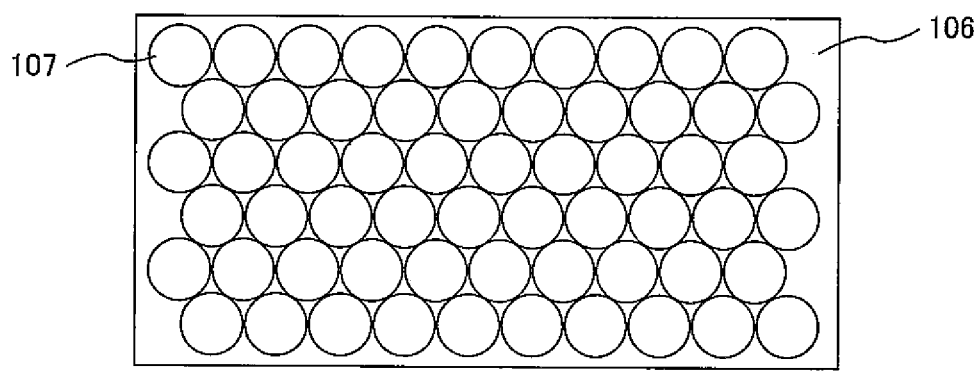
FIG. 22 is a schematic diagram showing a plan view of a surface of transparent resin layer of an organic light-emitting diode as seen from a side of an encapsulation glass in accordance with the first embodiment of the present invention.

FIG. 22 is a schematic diagram showing a plan view of a surface of transparent resin layer of an organic light-emitting diode as seen from a side of an encapsulation glass in accordance with the first embodiment of the present invention. As shown in FIG. 22, the cone-shaped transparent resin structures 107 are closely packed at the surface of the transparent resin layer 106 so that the gaps among the bases of the cone-shaped transparent resin structures 107 can be minimized, and as a result, light extraction efficiency can be improved all the more significantly.

Second Embodiment of the Invention

Figure 23:
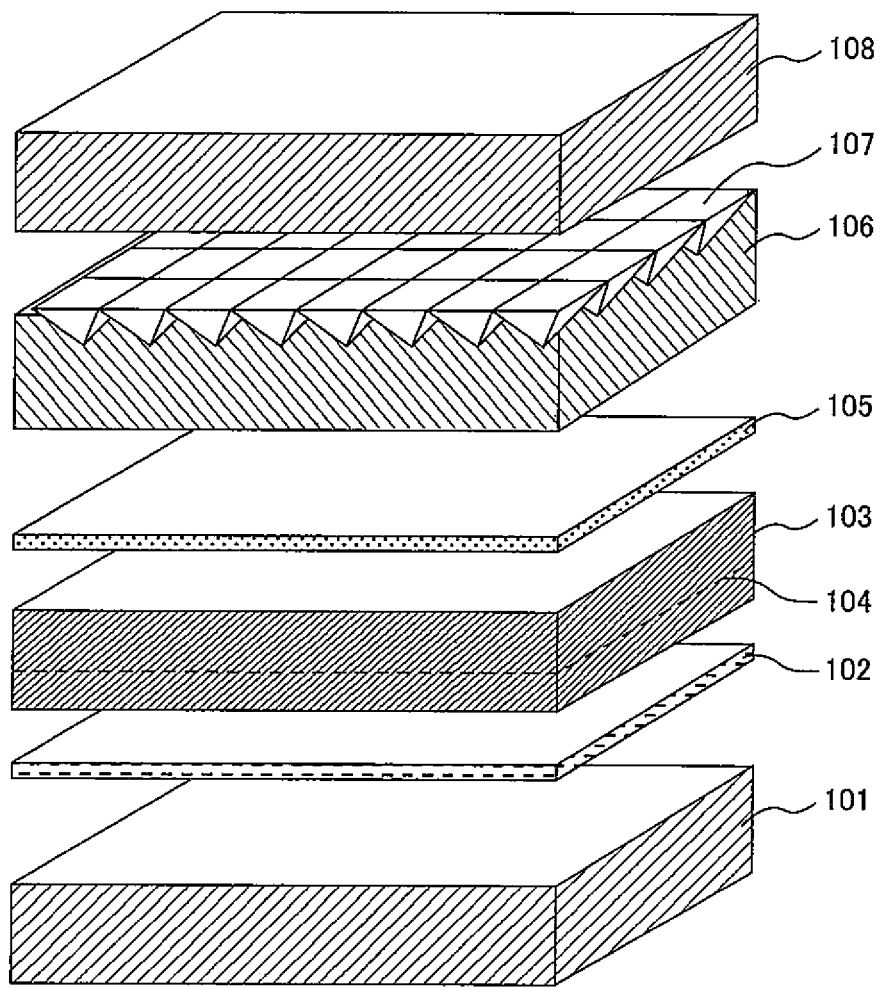
FIG. 23 is a schematic diagram showing an exploded perspective view of an organic light-emitting diode in accordance with a second embodiment of the present invention.

Another embodiment of the present invention will be described in detail hereinafter with reference to FIG. 23 and FIG. 24. FIG. 23 is a schematic diagram showing an exploded perspective view of an organic light-emitting diode in accordance with a second embodiment of the present invention. As shown in FIG. 23, the configuration in the present embodiment is identical to that in the first embodiment except that four-sided pyramid-shaped transparent resin structures 107 are disposed in a transparent resin layer 106.

Figure 24:
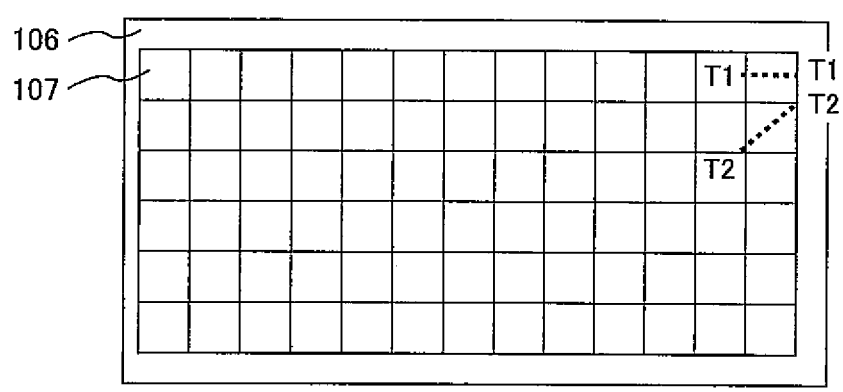
FIG. 24 is schematic diagrams showing a plan view of a surface of transparent resin layer of an organic light-emitting diode as seen from a side of an encapsulation glass, and cross-sectional views of the transparent resin layer along line T1-T1 and line T2-T2 in the plan view in accordance with the second embodiment of the present invention.
Figure 24:
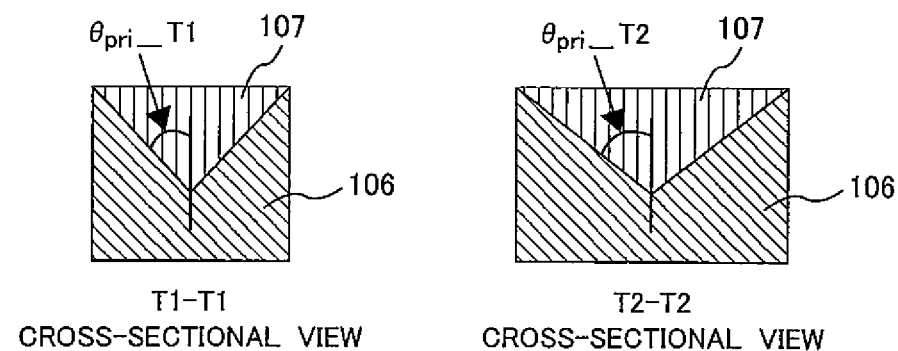

FIG. 24 is schematic diagrams showing a plan view of a surface of transparent resin layer of an organic light-emitting diode as seen from a side of an encapsulation glass, and cross-sectional views of the transparent resin layer along line T1-T1 and line T2-T2 in the plan view in accordance with the second embodiment of the present invention. The T1-T1 cross section has the minimum half angle of the cross-sectional pyramid apex angle ($\theta_{pri\_}$T1), and the T2-T2 cross section has the maximum half angle of the cross-sectional pyramid apex angle ($\theta_{pri\_}$T2).

As already described in FIGS. 5 to 12, light extraction efficiency reaches its peak value at the optimum value of $\theta_{pri}$ and tends to decrease sharply as $\theta_{pri}$ becomes smaller and to decrease gradually as $\theta_{pri}$ becomes larger. Therefore, the maximum light extraction efficiency can be obtained by setting $\theta_{pri\_}$T1, which is the minimum half angle of the cross-sectional apex angle of each of the four-sided pyramid-shaped transparent resin structures 107, at the value of the optimum $\theta_{pri}$ or any value smaller than this by about 5 degrees. Although the shape of each of the pyramid-shaped transparent resin structures 107 is a four-sided pyramid in FIGS. 23 and 24, it may be any pyramid in the present embodiment.

Third Embodiment of the Invention

Figure 25:
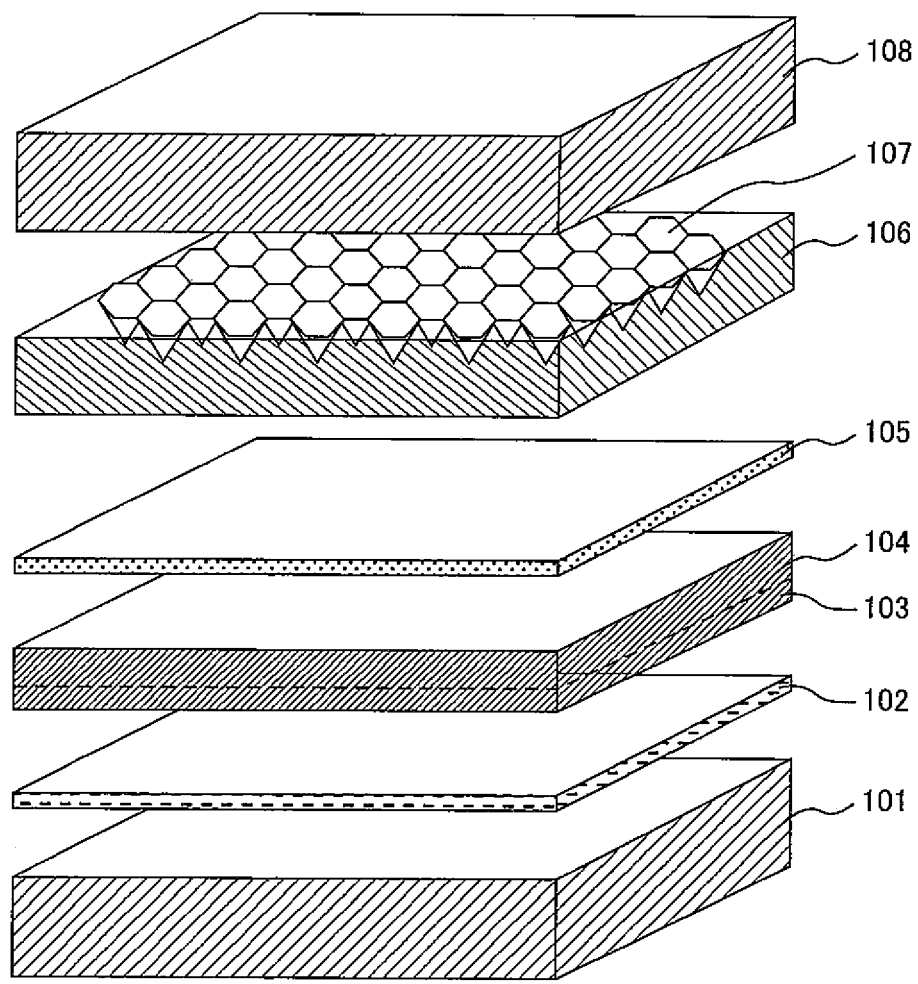
FIG. 25 is a schematic diagram showing an exploded perspective view of an organic light-emitting diode in accordance with a third embodiment of the present invention.

Yet another embodiment of the present invention will be described in detail hereinafter with reference to FIG. 25 and FIG. 26. FIG. 25 is a schematic diagram showing an exploded perspective view of an organic light-emitting diode in accordance with a third embodiment of the present invention. As shown in FIG. 25, the configuration in the present embodiment is identical to that in the first embodiment except that six-sided pyramid-shaped transparent resin structures 107 are disposed in a transparent resin layer 106.

Figure 26:
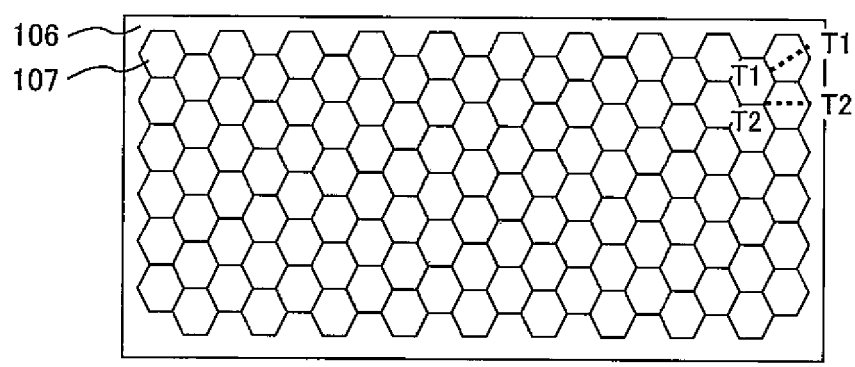
FIG. 26 is schematic diagrams showing a plan view of a surface of transparent resin layer of an organic light-emitting diode as seen from a side of an encapsulation glass, and cross-sectional views of the transparent resin layer along line T1-T1 and line T2-T2 in the plan view in accordance with the third embodiment of the present invention.
Figure 26:
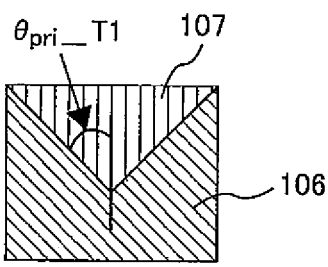
Figure 26:
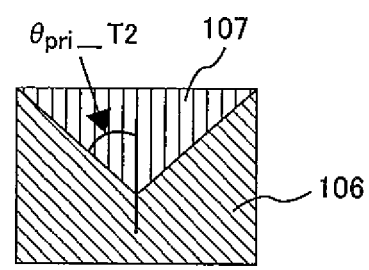

FIG. 26 is schematic diagrams showing a plan view of a surface of transparent resin layer of an organic light-emitting diode as seen from a side of an encapsulation glass, and cross-sectional views of the transparent resin layer along line T1-T1 and line T2-T2 in the plan view in accordance with the third embodiment of the present invention. The T1-T1 cross section has the minimum half angle of the cross-sectional pyramid apex angle ($\theta_{pri\_}$T1), and the T2-T2 cross section has the maximum half angle of the cross-sectional pyramid apex angle ($\theta_{pri\_}$T2).

As described in the second embodiment, the maximum light extraction efficiency can be obtained by setting $\theta_{pri\_}$T1, which is the minimum half angle of the cross-sectional apex angle of each of the six-sided pyramid-shaped transparent resin structures 107, at the value of the optimum $\theta_{pri}$ or any value smaller than this by about 5 degrees. Also, in the case of a six-sided pyramid, the difference between $\theta_{pri\_}$T1 and $\theta_{pri\_}$T2 is smaller than that in the case of a four-sided pyramid, which makes it possible to improve light extraction efficiency more significantly. In addition, the six-sided pyramid shaped transparent resin structures 107 can be closely packed and thus the gaps among the structures are smaller, which makes it possible to improve light extraction efficiency even more significantly.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An organic light-emitting diode, comprising:
   a reflective electrode;
   an organic layer formed on the reflective electrode, the organic layer including a light-emitting point;
   a transparent electrode formed on the organic layer;
   a transparent resin layer formed on the transparent electrode, the transparent resin layer including cone- or pyramid-shaped transparent resin structures; and
   an encapsulation glass formed on the transparent resin layer,
   wherein: each of the cone- or pyramid-shaped transparent resin structures splays from the transparent resin layer toward the encapsulation glass in a normal direction of the encapsulation glass; and
   a refractive index of the transparent resin layer is 1.3 times or more to 1.6 times or less as high as a refractive index of the cone- or pyramid-shaped transparent resin structures.

2. The organic light-emitting diode according to claim 1, wherein:
   the refractive index of the transparent resin layer is not less than 2.15 and not more than 2.25; and
   an apex angle (unit: degree) of a cross section including a normal line of the encapsulation glass of each of the cone- or pyramid-shaped transparent resin structures is "2(44.3x−18±5)", where "x" represents a ratio between the refractive index of the transparent resin layer and the refractive index of the cone- or pyramid-shaped transparent resin structures.

3. The organic light-emitting diode according to claim 2, wherein:
   the light-emitting point emits light at an emission peak wavelength of λ (unit: nm); and
   the following relationship is satisfied:

"$(2m-155/180)\lambda/4/n/(\cos 30°) \leq ad \leq (2m-155/180)\lambda/4/n/(\cos 46°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

4. The organic light-emitting diode according to claim 1, wherein:
   the refractive index of the transparent resin layer is not less than 2.05 and not more than 2.15; and
   an apex angle (unit: degree) of a cross section including a normal line of the encapsulation glass of each of the cone- or pyramid-shaped transparent resin structures is "2(44.3x−17.8±5)", where "x" represents a ratio between the refractive index of the transparent resin layer and the refractive index of the cone- or pyramid-shaped transparent resin structures.

5. The organic light-emitting diode according to claim 4, wherein:
   the light-emitting point emits light at an emission peak wavelength of λ (unit: nm); and
   the following relationship is satisfied:

"$(2m-155/180)\lambda/4/n/(\cos 30°) \leq ad \leq (2m-155/180)\lambda/4/n/(\cos 43°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

6. The organic light-emitting diode according to claim 1, wherein:
   the refractive index of the transparent resin layer is not less than 1.95 and not more than 2.05; and
   an apex angle (unit: degree) of a cross section including a normal line of the encapsulation glass of each of the cone- or pyramid-shaped transparent resin structures is "2(39.5x−10.3±5)", where "x" represents a ratio between the refractive index of the transparent resin layer and the refractive index of the cone- or pyramid-shaped transparent resin structures.

7. The organic light-emitting diode according to claim 6, wherein:
   the light-emitting point emits light at an emission peak wavelength of λ (unit: nm); and
   the following relationship is satisfied:

"$(2m-155/180)\lambda/4/n/(\cos 30°) \leq ad \leq (2m-155/180)\lambda/4/n/(\cos 45°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

8. The organic light-emitting diode according to claim 1, wherein:
the refractive index of the transparent resin layer is not less than 1.85 and not more than 1.95; and
an apex angle (unit: degree) of a cross section including a normal line of the encapsulation glass of each of the cone- or pyramid-shaped transparent resin structures is "2(37.5x−5.7±5)", where "x" represents a ratio between the refractive index of the transparent resin layer and the refractive index of the cone- or pyramid-shaped transparent resin structures.

9. The organic light-emitting diode according to claim 8, wherein:
the light-emitting point emits light at an emission peak wavelength of λ (unit: nm); and
the following relationship is satisfied:

"$(2m-155/180)\lambda/4n/(\cos 28°) \leq ad \leq (2m-155/180)\lambda/4n/(\cos 43°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

10. The organic light-emitting diode according to claim 1, wherein:
the refractive index of the transparent resin layer is not less than 1.75 and not more than 1.85; and
an apex angle (unit: degree) of a cross section including a normal line of the encapsulation glass of each of the cone- or pyramid-shaped transparent resin structures is "2(45.1x−12±5)", where "x" represents a ratio between the refractive index of the transparent resin layer and the refractive index of the cone- or pyramid-shaped transparent resin structures.

11. The organic light-emitting diode according to claim 10, wherein:
the light-emitting point emits light at an emission peak wavelength of λ (unit: nm); and
the following relationship is satisfied:

"$(2m-155/180)\lambda/4n/(\cos 28°) \leq ad \leq (2m-155/180)\lambda/4n/(\cos 44°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

12. The organic light-emitting diode according to claim 1, wherein:
the refractive index of the transparent resin layer is not less than 1.65 and not more than 1.75; and
an apex angle (unit: degree) of a cross section including a normal line of the encapsulation glass of each of the cone- or pyramid-shaped transparent resin structures is "2(48.9x−13.5±5)", where "x" represents a ratio between the refractive index of the transparent resin layer and the refractive index of the cone- or pyramid-shaped transparent resin structures.

13. The organic light-emitting diode according to claim 12, wherein:
the light-emitting point emits light at an emission peak wavelength of λ (unit: nm); and
the following relationship is satisfied:

"$(2m-155/180)\lambda/4n/(\cos 26°) \leq ad \leq (2m-155/180)\lambda/4n/(\cos 44°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

14. The organic light-emitting diode according to claim 1, wherein:
the refractive index of the transparent resin layer is not less than 1.55 and not more than 1.65; and
an apex angle (unit: degree) of a cross section including a normal line of the encapsulation glass of each of the cone- or pyramid-shaped transparent resin structures is "2(58x−20.7±5)", where "x" represents a ratio between the refractive index of the transparent resin layer and the refractive index of the cone- or pyramid-shaped transparent resin structures.

15. The organic light-emitting diode according to claim 14, wherein:
the light-emitting point emits light at an emission peak wavelength of λ (unit: nm); and
the following relationship is satisfied:

"$(2m-155/180)\lambda/4n/(\cos 24°) \leq ad \leq (2m-155/180)\lambda/4n/(\cos 43°)$", where "ad" represents a height from an interface between the reflective electrode and the organic layer to the light-emitting point ("d" (unit: nm) represents a thickness of the organic layer, and "a" represents a value more than 0 but less than 1 (0<a<1)); "n" represents a refractive index of the organic layer; and "m" represents an integer equal to 1 or greater.

16. The organic light-emitting diode according to claim 1, wherein the cone- or pyramid-shaped transparent resin structures are pyramid-shaped.

17. The organic light-emitting diode according to claim 1, wherein the cone- or pyramid-shaped transparent resin structures are cone-shaped.

18. The organic light-emitting diode according to claim 1, wherein the cone- or pyramid-shaped transparent resin structures are six-sided pyramid-shaped.

19. The organic light-emitting diode according to claim 1, wherein bases of the cone- or pyramid-shaped structures are closely packed on an interface between the encapsulation glass and the transparent resin layer.

20. A light source device including the organic light-emitting diode according to claim 1.

* * * * *